(12) United States Patent
Yeo et al.

(10) Patent No.: US 10,355,819 B2
(45) Date of Patent: Jul. 16, 2019

(54) APPARATUS AND METHOD FOR DECODING DATA IN MOBILE COMMUNICATION SYSTEM

(71) Applicant: Samsung Electronics Co., Ltd., Suwon-si, Gyeonggi-do (KR)

(72) Inventors: Jeongho Yeo, Hwaseong-si (KR); Younsun Kim, Seongnam-si (KR); Jinyoung Oh, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/674,977

(22) Filed: Aug. 11, 2017

(65) Prior Publication Data

US 2018/0048421 A1 Feb. 15, 2018

(30) Foreign Application Priority Data

Aug. 12, 2016 (KR) .................. 10-2016-0103250

(51) Int. Cl.
*H04L 1/00* (2006.01)
*H04L 1/18* (2006.01)
(Continued)

(52) U.S. Cl.
CPC .......... *H04L 1/0046* (2013.01); *H03M 13/29* (2013.01); *H03M 13/353* (2013.01);
(Continued)

(58) Field of Classification Search
CPC ... H04L 1/0046; H04L 1/1861; H04W 72/042
(Continued)

(56) References Cited

U.S. PATENT DOCUMENTS

2009/0147877 A1* 6/2009 Connors ............... H04L 1/0084
375/267
2010/0260266 A1* 10/2010 Gholmieh ............... H04L 1/005
375/240.25

(Continued)

FOREIGN PATENT DOCUMENTS

WO 2010/118363 A2 10/2010
WO 2016/159730 A1 10/2016

OTHER PUBLICATIONS

Qualcomm Incorporated, "Outer Erasure Code", 3GPP TSG-RAN WG1 #84b, R1-162397, Apr. 11-15, 2016, pp. 1-3, Busan, Korea.
(Continued)

*Primary Examiner* — Hirdepal Singh
(74) *Attorney, Agent, or Firm* — Jefferson IP Law, LLP

(57) ABSTRACT

The present disclosure relates to a communication method and system for converging a 5th-Generation (5G) communication system for supporting higher data rates beyond a 4th-Generation (4G) system with a technology for Internet of Things (IoT). The present disclosure may be applied to intelligent services based on the 5G communication technology and the IoT-related technology, such as smart home, smart building, smart city, smart car, connected car, health care, digital education, smart retail, security and safety services. A method for decoding by a terminal in a mobile communication system is provided. The method includes receiving data from a base station, receiving setting information on whether a second channel code which is an outer code for a first channel code is set from the base station, determining whether to decode the data by using the second channel code depending on the setting information, and performing the decoding based on a result of the determined.

19 Claims, 17 Drawing Sheets

(51) Int. Cl.

| | | |
|---|---|---|
| *H04W 72/04* | (2009.01) | |
| *H03M 13/29* | (2006.01) | |
| *H03M 13/35* | (2006.01) | |
| *H03M 13/00* | (2006.01) | |
| *H03M 13/09* | (2006.01) | |
| *H03M 13/11* | (2006.01) | |
| *H03M 13/13* | (2006.01) | |
| *H03M 13/15* | (2006.01) | |
| *H03M 13/23* | (2006.01) | |

(52) U.S. Cl.
CPC ...... *H03M 13/6306* (2013.01); *H04L 1/0023* (2013.01); *H04L 1/0045* (2013.01); *H04L 1/0057* (2013.01); *H04L 1/0065* (2013.01); *H04L 1/0075* (2013.01); *H04L 1/1812* (2013.01); *H04L 1/1861* (2013.01); *H04W 72/042* (2013.01); *H03M 13/09* (2013.01); *H03M 13/1102* (2013.01); *H03M 13/13* (2013.01); *H03M 13/152* (2013.01); *H03M 13/1515* (2013.01); *H03M 13/23* (2013.01); *H03M 13/2957* (2013.01)

(58) Field of Classification Search
USPC .......................................................... 375/340
See application file for complete search history.

(56) References Cited

U.S. PATENT DOCUMENTS

| | | | | |
|---|---|---|---|---|
| 2010/0296601 | A1* | 11/2010 | Kim ...................... | H03M 13/29 375/295 |
| 2012/0087314 | A1* | 4/2012 | Maeda .................... | H04L 5/001 370/328 |
| 2012/0304037 | A1* | 11/2012 | Reddy ................. | G06F 11/1012 714/763 |
| 2014/0044061 | A1* | 2/2014 | Yue ..................... | H04W 72/042 370/329 |
| 2015/0222472 | A1* | 8/2015 | Park ..................... | H04B 1/0475 375/261 |
| 2015/0381209 | A1* | 12/2015 | Roh ...................... | H03M 13/27 714/755 |
| 2016/0352419 | A1* | 12/2016 | Fonseka ............. | H04B 10/0793 |
| 2017/0048861 | A1 | 2/2017 | Choi et al. | |
| 2017/0171739 | A1* | 6/2017 | Suzuki ..................... | H04W 8/24 |
| 2017/0324511 | A1* | 11/2017 | Moosavi ............... | H04L 1/0038 |
| 2018/0041858 | A1* | 2/2018 | Sheng ..................... | H04W 4/70 |
| 2018/0145703 | A1* | 5/2018 | Li ........................ | H03M 13/095 |

OTHER PUBLICATIONS

ZTE, "Discussion on Channel Coding for New Radio Interface", 3GPP TSG RAN WG1 #84bis, R1-162230, Apr. 11-15, 2016, pp. 1-12, Busan, Korea.

Interdigital Communications, "Outer Erasure Code for Efficient Multiplexing", 3GP TSG-RAN WG1 #85, R1-164667, May 23-27, 2016, pp. 1-3, Nanjing, China.

European Search Report dated Jan. 16, 2018, issued in European Patent Application No. 17186026.5-1220.

Siemens: "Proposal for Outer coding for MBMS", 3GPP Draft; GP-040716_MBMS_OUTER_CODING_PROPOSAL,vol. TSG GERAN, No. Cancun; 20040416, Apr. 16, 2004 (Apr. 16, 2004), XP050010724.

European Office Action dated Apr. 2, 2019; Application #: 17 186 026.5 - 1220; Ref. #: P17385EP.

* cited by examiner

APPARATUS AND METHOD FOR DECODING DATA IN MOBILE COMMUNICATION SYSTEM

CROSS-REFERENCE TO RELATED APPLICATION(S)

This application claims the benefit under 35 U.S.C. § 119(a) of a Korean patent application filed on Aug. 12, 2016 in the Korean Intellectual Property Office and assigned Serial number 10-2016-0103250, the entire disclosure of which is incorporated hereby incorporated by reference.

TECHNICAL FIELD

The present disclosure relates to an apparatus and method for decoding data in a mobile communication system. More particularly, the present disclosure relates to a method for configuring inner code decoding and outer code decoding and performing the outer code decoding.

BACKGROUND

To meet a demand for radio data traffic that is on an increasing trend since commercialization of a fourth generation (4G) communication system, efforts to develop an improved fifth generation (5G) communication system or a pre-5G communication system have been conducted. For this reason, the 5G communication system or the pre-5G communication system is called a beyond 4G network communication system or a post long term evolution (LTE) system.

To achieve a high data transmission rate, the 5G communication system is considered to be implemented in a super high frequency (mmWave) band (e.g., like 60 GHz band). To relieve a path loss of a radio wave and increase a transfer distance of the radio wave in the super high frequency band, in the 5G communication system, beamforming, massive multiple input/multiple output (MIMO), full dimensional MIMO (FD-MIMO), array antenna, analog beam-forming, and large scale antenna technologies have been discussed.

Further, to improve a network of the system, in the 5G communication system, technologies such as evolved small cell, advanced small cell, cloud radio access network (cloud RAN), ultra-dense network, device to device communication (D2D), wireless backhaul, moving network, cooperative communication, coordinated multi-points (COMP), and received interference cancellation have been developed. In addition, in the 5G system, hybrid frequency-shift keying (FSK) and quadrature amplitude modulation (QAM) modulation (FQAM) and sliding window superposition coding (SWSC) that are an advanced coding modulation (ACM) scheme and a filter bank multi carrier (FBMC), a non-orthogonal multiple access (NOMA), and a sparse code multiple access (SCMA) that are an advanced access technology, and so on have been developed.

Meanwhile, the Internet is evolving from a human-centric communication network in which information is generated and consumed by humans to the internet of things (IoT) network in which distributed components such as things exchange and process information. Internet of Everything (IoE) technology in which big data processing technology through connection with a cloud server, or the like is combined with the IoT technology also is emerging. In order to implement the IoT, technology elements such as the sensing technology, wired/wireless communication and network infrastructure, service interface technology, and security technology are required, thus, recent, research into the sensor network, machine to machine (M2M), and machine type communication (MTC) technologies for connection between things has been conducted. In the IoT environment, it is possible to provide an intelligent internet technology (IT) that is capable of collecting and analyzing data generated from connected things to create new values for human life. The IoT may be applied to various fields such as smart home, smart building, smart city, smart car or connected car, smart grid, health care, smart appliance, and advanced medical service through existing information technology (IT) and fusion and convergence between various industries.

Thus, there are various attempts to apply the 5G communication system to the IoT network. For example, the sensor network, M2M, and MTC technologies are implemented by means of 5G communication technologies such as beamforming, MIMO, and array antenna. The application of the above-described cloud RAN as a big data processing technology is an example of convergence between the 5G technology and the IoT technology.

As such, a plurality of services may be provided to a user in a communication system, and in order to provide the user with the plurality of services, a method capable of providing each service while meeting characteristics within the same time interval and an apparatus using the same are required.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide a method for decoding data by efficiently setting an outer code.

In accordance with an aspect of the present disclosure, a method for decoding by a terminal in a mobile communication system is provided. The method for decoding by a terminal in a mobile communication system includes receiving data from a base station, receiving setting information on whether a second channel code which is an outer code for a first channel code is set from the base station, determining whether to decode the data by using the second channel code depending on the setting information, and performing the decoding based on a result of the determination.

The first channel code may be any one of a convolutional code, a low density parity check (LDPC) code, a turbo code, or a polar code.

The second channel code may be any one of a reed-solomon code, a bose chaudhuri hocquenghem (BCH) code, a raptor code, and a parity bit generation code.

The setting information may be received through higher layer signaling, indicate that the second channel code is set if the setting information is a first value, and indicate that the second channel code is not set if the setting information is a second value.

The method may further include determining whether transmission type information coincides with setting type information that is set in advance that the second channel code is applied if the setting information is the transmission type information of at least one of the data or a control signal, and performing the decoding by applying the second channel code if the transmission type information coincides with the setting type information.

The setting information may be set within downlink control information (DCI).

The method may further include determining whether to perform the decoding for the second channel code based on at least one of a result of a comparison between a modulation and coding scheme (MCS) and a first threshold value, or a result of a comparison between a size of the data and a second threshold value, if the setting information is at least one of the MCS or the size of data included in control information at the time of data transmission scheduling.

The method may further include performing channel coding decoding of the data by a code block unit, and checking a first number of code block of which the channel coding decoding is failed according to a result of the channel coding decoding.

The method may further include transmitting hybrid automated repeat request acknowledge (HARQ ACK) to the base station without performing first channel coding decoding and second channel coding decoding of parity code blocks, if there is no code block of which the channel coding decoding is failed.

The method may further include checking a second number of code block that is restored through second channel coding decoding related to the second channel code, restoring the code block of which the channel coding decoding is failed by performing first channel coding decoding and the second channel coding decoding of a parity code block, if the first number is smaller than the second number, and transmitting HARQ ACK to the base station when the restoring succeeds.

The method may further include checking a second number of code block that is restored through second channel coding decoding related to the second channel code, and transmitting HARQ negative acknowledge (NACK) to the base station without performing first channel coding decoding and the second channel coding decoding of a parity code block, if the first number is larger than the second number.

In accordance with another aspect of the present disclosure, a method for configuring decoding by a base station in a mobile communication system is provided. The method for configuring decoding by a base station in a mobile communication system includes generating setting information on whether a second channel code which is an outer code for a first channel code is set, and transmitting the setting information to a terminal, in which whether to decode the data transmitted from the base station to the terminal by using the second channel code depending on the setting information may be determined.

The decoding method and apparatus according to the embodiments of the present disclosure have an effect of reducing the calculation of the terminal and power consumption by decoding data by efficiently setting the outer code.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, like reference numerals will be understood to refer to like parts, components, and structures.

DETAILED DESCRIPTION

Figure 1:
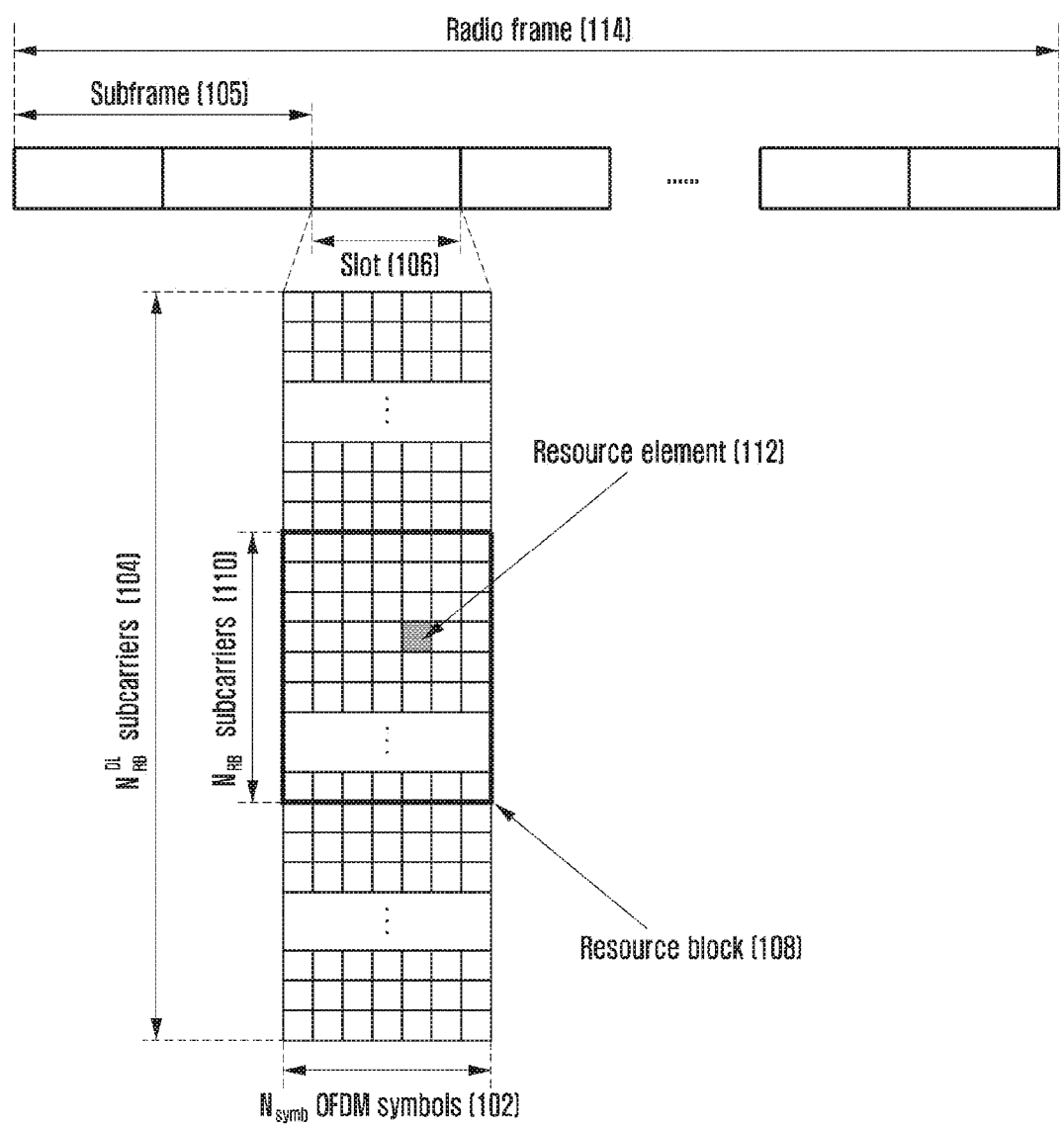
FIG. 1 is a diagram showing a downlink time-frequency domain transmission structure in a mobile communication system according to an embodiment of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

For the same reason, some elements are exaggerated, omitted, or schematically illustrated in the accompanying drawings. Further, each element may have a size different from those shown in the drawings. The same reference numerals throughout the drawings denote the same or corresponding element.

It will be understood that each block in flowcharts and combinations of the flowcharts may be performed via computer program instructions. These computer program instructions may be installed in processors of general computers, special computers or other programmable data processing equipment, thus the instructions performed through the processors of the computer or other programmable data processing equipment may generate a means for performing functions described in a block(s) of the flowchart. These computer program instructions may also be stored in a computer-readable memory that may direct a computer or other programmable data processing equipment to implement functions in a particular manner, such that the instructions stored in the computer-readable memory produce an article of manufacture including the instruction means that implements the function described in the block(s) of the flowcharts. The computer program instructions may also be loaded onto a computer or other programmable data processing equipment to cause a series of operations to be performed on the computer or other programmable data processing equipment to produce a process executed by the computer such that the instructions executed on the computer or other programmable data processing equipment may also provide operations for implementing the functions described in the block(s) of the flowcharts.

Further, the respective block may indicate parts of modules, segments, or codes including one or more executable instructions for performing specific logical function(s). Further, it should be noted that the functions mentioned in the blocks may be performed in different order in several alternative embodiments. For example, two blocks illustrated successively may be performed substantially at the same time, or may be performed in reverse order according to their functions.

Here, a term "~unit" used in the embodiments of the present disclosure mean, but is not limited to, a software or hardware element such as a field programmable gate array (FPGA) or application specific integrated circuit (ASIC), which performs certain roles. A "~unit" may be configured to reside on an addressable storage medium or configured to execute one or more processors. Thus, a "~unit" may include, for example, elements, such as software elements, object-oriented software elements, class elements and task elements, processes, functions, attributes, procedures, subroutines, segments of a program code, drivers, firmware, microcode, circuitry, data, databases, data structures, tables, arrays, and variables. Functions provided in the elements and the "~units" may be combined into fewer elements and "~units" or further separated into additional elements and "~units". In addition, the elements and "units" may also be implemented such that they execute one or more central processing units (CPUs) in a device or a secure multimedia card. Further, in the embodiments, the "~unit" may include one or more processors.

A wireless communication system has been developed as a broadband wireless communication system providing a high-speed and high-quality packet data service like communication standards such as, for example, high speed packet access (HSPA) of $3^{rd}$ generation partnership project (3GPP), long term evolution (LTE) or evolved universal terrestrial radio access (E-UTRA), LTE-Advanced (LTE-A), high rate packet data (HRPD) of 3GPP2, ultra mobile broadband (UMB), and 802.16e of institute of electrical and electronics engineers (IEEE). Further, communication standards of fifth generation (5G) or new radio (NR) as a 5th generation wireless communication system have been created.

In the wireless communication system including the 5th generation as described above, at least one service of enhanced mobile broadband (eMBB), massive machine type communications (mMTC) and ultra-reliable and low-latency communications (URLLC) may be provided to a terminal. The services may be provided to the same terminal during the same time interval. In the embodiments, the eMBB may be a service aiming to implement high speed transmission of massive data, the mMTC may be a service aiming to minimize terminal power and implement connection of a plurality of terminals, and the URLLC may be a service aiming to implement high reliability and low latency, but the eMBB, the mMTC, and the URLLC are not limited thereto. The three services may be a main scenario in the LTE system or the post LTE system such as 5G/NR (new radio, next radio). In the embodiments, a method for coexistence of the eMBB and the URLLC, or coexistence of the mMTC and the URLLC, and an apparatus using the same will be described.

When a base station schedules transmission of data corresponding to the eMBB service in a specific transmission time interval (TTI) for a specific terminal, if the URLLC data need to be transmitted in the TTI, some of the eMBB data may not be transmitted in a frequency band in which the eMBB data transmission is already scheduled and performed, and the generated URLLC data may be transmitted in the frequency band. A terminal scheduled for the eMBB transmission, and a terminal scheduled for the URLLC transmission may be the same terminal or terminals different from each other. In this case, since some of the eMBB data that are already being scheduled and transmitted are not transmitted, a possibility that the eMBB data are damaged increases. Accordingly, a method for processing a signal received from the terminal scheduled for the eMBB transmission or the terminal scheduled for the URLLC transmission in the above described case, and a method for receiving the signal need to be determined. Therefore, in the embodiments, a method for coexistence of heterogeneous services in which information for each service may be transmitted when information for the eMBB and information for the URLLC are simultaneously scheduled, when information for the mMTC and information for the URLLC are simultaneously scheduled, or when information for the eMBB, information for the URLLC, and information for the mMTC are simultaneously scheduled, by sharing some or entire frequency band, will be described.

Hereinafter, embodiments of the present disclosure will be described in detail with reference to the accompanying drawings. In explaining the present disclosure, when it is determined that the detailed description for the relevant feature or components may unnecessarily obscure the gist of the present disclosure, the detailed description therefor will be omitted. Further, the following terminologies are defined in consideration of the functions in the present disclosure and may be construed in different ways by users, an intention of operators, or conventions. Therefore, the definitions thereof should be construed based on the contents throughout the specification. Hereinafter, a base station may be at least one of an evolved node B (eNode B), a Node B, a BS, a radio access unit, a base station controller, and a node on a network, as a subject performing resource allocation of a terminal. A terminal may include user equipment (UE), a mobile station (MS), a cellular phone, a smartphone, a computer, or a multimedia system capable of performing a communication function. In the present disclosure, a downlink (DL) means a wireless transmission path of a signal transmitted by the base station to the terminal, and an uplink (UL) means a wireless transmission path of a signal transmitted by the terminal to the base station. Further, hereinafter, embodiments of the present disclosure will be described with the LTE or LTE-A system by way of example, but the embodiments of the present disclosure may also be applied to other communication systems having similar technical background or channel type. For example, the other communication systems may include the 5th generation mobile communication technology (5G, new radio (NR)) developed subsequently to the LTE-A. Further, the embodiments of the present disclosure may also be applied to other communication systems through some modification without departing from the scope of the present disclosure based on determination by a person skilled in the art.

An LTE system, as a representative example of the broadband wireless communication system, uses an orthogonal frequency division multiplexing (OFDM) scheme in a downlink DL, and a single carrier frequency division multiple access scheme in an UL. The uplink means a wireless link through which a terminal (or user equipment (UE)) or a mobile station MS transmits data or a control signal to a base station (BS) (or eNodeB), and the downlink means a wireless link through which a base station transmits data or a control signal to a terminal. The multiple access scheme as described above is generally allocated and operated so that time-frequency resources for carrying data or control information for each user do not overlap with each other, that is orthogonality is implemented, thereby classifying data or control information of each user.

In the LTE system, in a case in which decoding failure occurs during initial transmission, a hybrid automatic repeat request (HARQ) scheme in which the corresponding data is retransmitted in a physical layer is used. In the HARQ scheme, when a receiver did not accurately decode data, the receiver transmits information informing of decoding failure (negative acknowledgement (NACK)) to a transmitter, such that the transmitter may retransmit the corresponding data in the physical layer. The receiver combines the data retransmitted by the transmitter with the data previously failed to be decoded to increase data reception performance. Further, when the receiver accurately decodes the data, the receiver transmits information informing of decoding success (acknowledgement (ACK)) to the transmitter, such that the transmitter transmits new data.

FIG. 1 is a diagram showing a downlink time-frequency domain transmission structure in a mobile communication system according to an embodiment of the present disclosure.

FIG. 1 is a diagram illustrating a basic structure of a time-frequency domain that is a wireless resource region in which the data or control channel is transmitted in the downlink, in the LTE system or a system similar to the LTE system.

Referring to FIG. 1, a horizontal axis represents a time domain, and a vertical axis represents a frequency domain. A minimum transmission unit in the time domain is a OFDM symbol, $N_{symb}$ OFDM symbols 102 configure one slot 106, and 2 slots configure one subframe 105. A length of the slot is 0.5 ms, and a length of the subframe is 1.0 ms. Further, a radio frame 114 is a time domain period configured of 10 subframes. A minimum transmission unit in the frequency domain is a subcarrier, and a bandwidth of entire system transmission band is configured of a total of $N_{BW}$ subcarriers 104. However, such a specific numerical value may be variably applied.

In the time-frequency domain, a basic unit of a resource is resource element (RE) 112, which may be indicated by an OFDM symbol index and a subcarrier index. A resource block (RB) (or physical resource block, PRB) 108 may be defined as $N_{symb}$ continuous OFDM symbols 102 in the time domain and $N_{RB}$ continuous subcarriers 110 in the frequency domain. Therefore, one RB 108 may include $N_{symb} \times N_{RB}$ REs 112 in one slot. Generally, a minimum allocation unit of data in the frequency domain is the RB. In the LTE system, generally, $N_{symb}=7$, and $N_{RB}=12$, and $N_{BW}$ and $N_{RB}$ may be in proportion to the bandwidth of the system transmission band. Data rate is increased in proportion to the number of RBs scheduled to the terminal. The LTE-A system may be operated by defining 6 transmission bandwidths. In a case of the FDD system operated by dividing the downlink and the uplink with frequency, a transmission bandwidth of the downlink and a transmission bandwidth of the uplink may be different from each other. A channel bandwidth represents an RF bandwidth corresponding to the system transmission bandwidth. The following Table 1 shows a corresponding relationship between the system transmission bandwidth and the channel bandwidth defined in the LTE system. For example, in an LTE system having 10 MHz of channel bandwidth, a transmission bandwidth thereof may be configured of 50 RBs.

TABLE 1

| | Channel bandwidth $BW_{Channel}$ [MHz] | | | | | |
|---|---|---|---|---|---|---|
| | 1.4 | 3 | 5 | 10 | 15 | 20 |
| Transmission bandwidth configuration $N_{RB}$ | 6 | 15 | 25 | 50 | 75 | 100 |

Downlink control information may be transmitted within first N OFDM symbols in the subframe. In embodiments, generally, N={1, 2, 3}. Accordingly, the N value may be variably applied for each subframe depending on an amount of control information to be transmitted in the current subframe. The control information to be transmitted may include a control channel transmission period indicator indicating the number of OFDM symbols within which the control information is transmitted, scheduling information on downlink data or uplink data, and information on HARQ ACK/NACK.

In the LTE system, the scheduling information on the downlink data or the uplink data is transmitted from the base station to the terminal through downlink control information (DCI). The DCI is defined according to various formats, may indicate whether it is the scheduling information (UL grant) on the uplink data or the scheduling information (DL grant) on the downlink data, whether it is a compact DCI having small control information, whether spatial multiplexing using multi-antenna is used, whether it is a DCI for power control, or the like. For example, DCI format 1 that is scheduling control information (DL grant) on the downlink data may include one of the following control information.

Resource allocation type 0/1 flag: It is indicated whether a resource allocation type is type 0 or type 1. The type 0 uses a bitmap scheme to allocate resources in a resource block group (RBG) unit. In the LTE system, a basic unit of the scheduling is a resource block (RB) represented as the time and frequency domain resource, and the RBG is configured of a plurality of RBs to be a basic unit of the scheduling in the type 0 scheme. The type 1 assigns a specific RB in an RBG.

Resource block assignment: An RB assigned to data transmission is indicated. A resource represented is determined depending on a system bandwidth and a resource allocation scheme.

Modulation and coding scheme (MCS): A modulation scheme used for data transmission and a size of a transport block that is data desired to be transmitted are indicated.

HARQ process number: HARQ process number is indicated.

New data indicator: It is indicated whether transmission of the HARQ is initial transmission or re-transmission.

Redundancy version: A redundancy version of HARQ is indicated.

Transmit power control (TPC) command for physical uplink control channel (PUCCH): A transmit power control command for PUCCH that is an uplink control channel is indicated.

The DCI may be transmitted through a physical downlink control channel (or control information, hereinafter, both are mixedly used) or an enhanced PDCCH (or enhanced control information, hereinafter, both are mixedly used) after going through a channel coding and modulation process.

Generally, the DCI is independently scrambled with a specific radio network temporary identifier (RNTI) (or terminal identifier) for each terminal, a cyclic redundancy check (CRC) is added, and channel coding is performed, and then the DCI is each configured as an independent PDCCH and transmitted. The PDCCH is mapped and transmitted during the control channel transmission period in a time domain. A mapping position of a frequency domain of the PDCCH may be determined by an identifier (ID) of each terminal and spread over entire system transmission band to be transmitted.

The downlink data may be transmitted through a physical downlink shared channel (PDSCH) that is a physical channel for downlink data transmission. The PDSCH may be transmitted after the control channel transmission period, and scheduling information such as a specific mapping position in the frequency domain, a modulation scheme, and the like are determined based on the DCI that is transmitted through the PDCCH.

The base station notifies the terminal of a modulation scheme applied to the PDSCH to be transmitted and a size (transport block size (TBS)) of data to be transmitted, through the MCS among the control information configuring the DCI. In the embodiments, the MCS may be configured of 5 bits, or more or less. The TBS corresponds to a size before the channel coding for error correction is applied to the data (transport block (TB)) that the base station desires to transmit.

A modulation scheme supported by the LTE system includes quadrature phase shift keying (QPSK), 16 quadrature amplitude modulation (QAM), and 640 QAM. A modulation order ($Q_m$) thereof is 2, 4, and 6, respectively. That is, in a case of the QPSK modulation, 2 bit per symbol may be transmitted, and in a case of the 16 QAM, 4 bits per symbol may be transmitted, and in a case of the 64 QAM, 6 bits per symbol may be transmitted. Further, a modulation scheme of 256 QAM or more may also be used according to system deformation.

Figure 2:
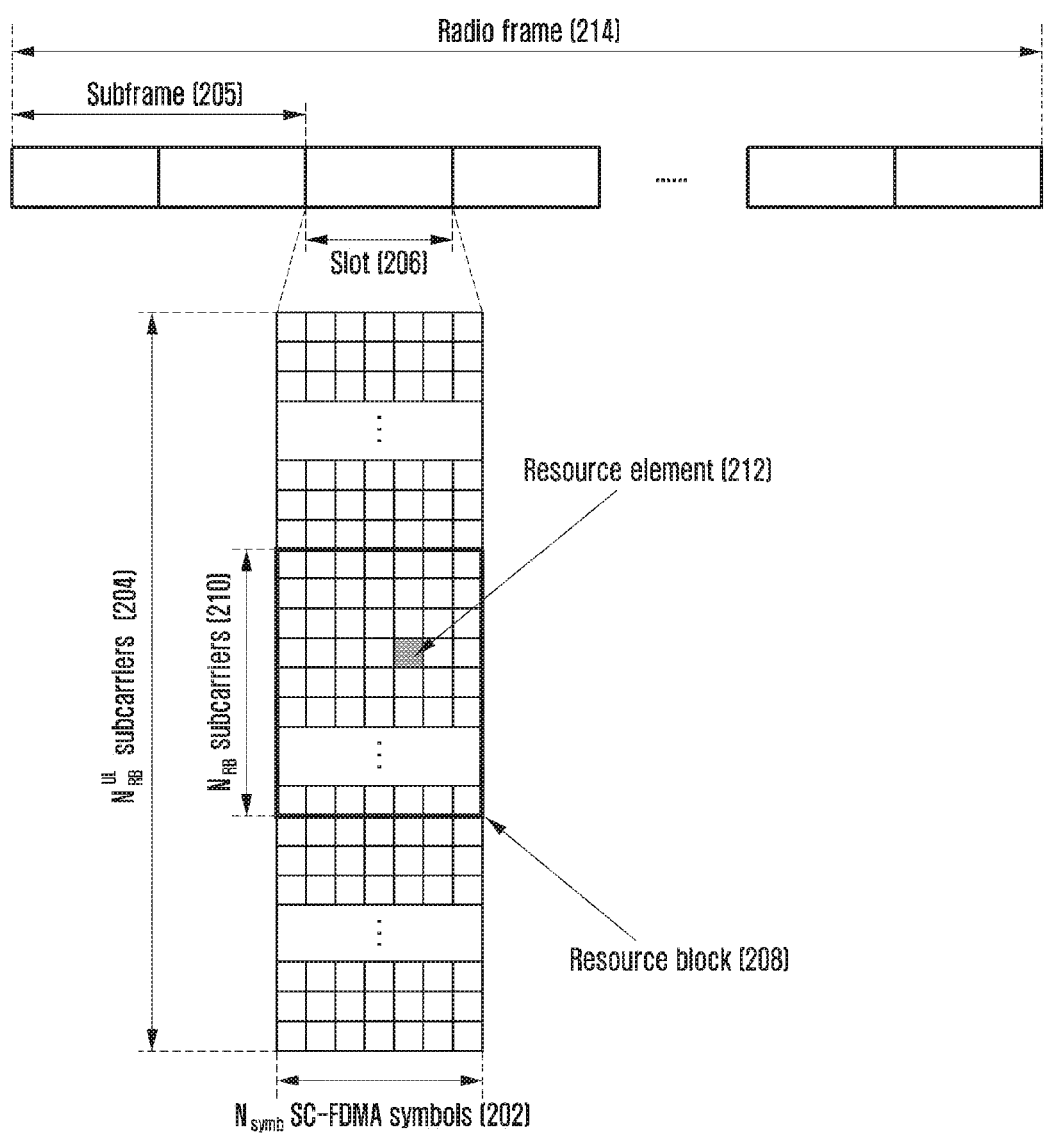
FIG. 2 is a diagram showing an uplink time-frequency domain transmission structure in a mobile communication system according to an embodiment of the present disclosure.

FIG. 2 is a diagram illustrating a basic structure of a time-frequency domain that is a wireless resource region in which the data or control channel is transmitted in the downlink.

Referring to FIG. 2, a horizontal axis represents a time domain, and a vertical axis represents a frequency domain. A minimum transmission unit in the time domain is a SC-FDMA symbol 202, and $N_{symb}^{UL}$ SC-FDMA symbols may be gathered to configure one slot 206. Further, two slots are gathered to configure one subframe 205. Further, a radio frame 214 is a time domain period configured of 10 subframes. A minimum transmission unit in the frequency domain is a subcarrier, and a bandwidth of entire system transmission band is configured of a total of $N_{BW}$ subcarriers 204. $N_{BW}$ may a value proportional to the system transmission band.

In the time-frequency domain, a basic unit of a resource is resource element (RE) 212, which may be defined as an SC-FDMA symbol index and a subcarrier index. A resource block pair (RB pair) 208 may be defined as $N_{symb}^{UL}$ continuous SC-FDMA symbols in the time domain and $N_{sc}^{RB}$ continuous subcarriers 210 in the frequency domain. Therefore, one RB is configured of $N_{symb}^{UL} \times N_{sc}^{RB}$ REs. Generally, a minimum transmission unit of the data or control information is the RB. In the case of PUCCH, it is mapped to a frequency domain corresponding to 1 RB and transmitted during one subframe.

In the LTE system, a timing relationship of PUCCH or PUSCH which is an uplink physical channel through which HARQ ACK/NACK corresponding to PDSCH which is a physical channel for downlink data transmission or PDCCH/EPDCCH including semi-persistent scheduling release (SPS release) is transmitted may be defined. For example, in the LTE system operating in frequency division duplex (FDD), the HARQ ACK/NACK corresponding to the PDSCH transmitted in a (n−4)-th subframe or PDCCH/EPDCCH including SPS release may be transmitted through the PUCCH or the PUSCH in an n-th subframe.

In the LTE system, the downlink HARQ adopts an asynchronous HARQ scheme in which data retransmission timing is not fixed. That is, when receiving HARQ NACK as a feedback from the terminal for initial transmission data transmitted by the base station, the base station freely decides transmission timing of retransmission data by the scheduling operation. The terminal may perform buffering on data determined as an error as a result of decoding received data for the HARQ operation, and combine the buffered data with the next retransmission data.

When receiving the PDSCH including the downlink data transmitted from the base station in a subframe n, the terminal transmits the uplink control information including the HARQ ACK/NACK of the downlink data in a subframe n+k through the PUCCH or PUSCH. In this case, k may be defined differently depending on whether the LTE system is operated in FDD or time division duplex (TDD) and depending on its subframe configuration. For example, in the case of FDD LTE system, k is fixed as 4. In the case of TDD LTE system, on the other hand, k may vary depending on the subframe configuration and a subframe number. Further, at the time of data transmission through a plurality of carriers, different k values may be applied depending on TDD configuration of each carrier. In the case of TDD, the k value is determined depending on TDD UL/DL configuration as shown in the following Table 2.

TABLE 2

| UL-DL Configuration | Subframe n | | | | | | | | | |
|---|---|---|---|---|---|---|---|---|---|---|
| | 0 | 1 | 2 | 3 | 4 | 5 | 6 | 7 | 8 | 9 |
| 0 | — | — | 6 | — | 4 | — | — | 6 | — | 4 |
| 1 | — | — | 7, 6 | 4 | — | — | — | 7, 6 | 4 | — |
| 2 | — | — | 8, 7, 4, 6 | — | — | — | — | 8, 7, 4, 6 | — | — |
| 3 | — | — | 7, 6, 11 | 6, 5 | 5, 4 | — | — | — | — | — |
| 4 | — | — | 12, 8, 7, 11 | 6, 5, 4, 7 | — | — | — | — | — | — |
| 5 | — | — | 13, 12, 9, 8, 7, 5, 4, 11, 6 | — | — | — | — | — | — | — |
| 6 | — | — | 7 | 7 | 5 | — | — | 7 | 7 | — |

In the LTE system, unlike the downlink HARQ, the uplink HARQ adopts a synchronous HARQ scheme in which data retransmission timing is fixed. That is, the uplink/downlink timing relationship between the PUSCH that is a physical channel for uplink data transmission, the PDCCH that is a downlink control channel preceding thereto, and a physical hybrid indicator channel (PHICH) that is a physical channel through which the downlink HARQ ACK/NACK corresponding to the PUSCH is transmitted, may be transmitted and received by the following rule.

When receiving the PDCCH including the uplink scheduling control information transmitted from the base station or the PHICH through which the downlink HARQ ACK/NACK is transmitted in the subframe n, the terminal transmits the uplink data corresponding to the control information in the subframe n+k through the PUSCH. In this case, k may be defined differently depending on whether the LTE system is operated in FDD or TDD and depending on its configuration. For example, in the case of FDD LTE system, k may be fixed as 4. In the case of TDD LTE system, on the other hand, k may vary depending on the subframe configuration and a subframe number. Further, at the time of data transmission through a plurality of carriers, different k values may be applied depending on TDD configuration of each carrier. In the case of TDD, the k value is determined depending on TDD UL/DL configuration as shown in the following Table 3.

TABLE 3

| TDD UL/DL Configuration | subframe index n | | | | | | | | | |
|---|---|---|---|---|---|---|---|---|---|---|
| | 0 | 1 | 2 | 3 | 4 | 5 | 6 | 7 | 8 | 9 |
| 0 | | | 4 | 7 | 6 | | | 4 | 7 | 6 |
| 1 | | | 4 | 6 | | | | 4 | 6 | |
| 2 | | | 6 | | | | | 6 | | |
| 3 | | | 6 | 6 | 6 | | | | | |
| 4 | | | 6 | 6 | | | | | | |
| 5 | | | 6 | | | | | | | |
| 6 | | | 4 | 6 | 6 | | | | 4 | 7 |

The HARQ ACK/NACK information of the PUSCH transmitted by the terminal in the subframe n is transmitted from the base station to the terminal through the PHICH in the subframe n+k. In this case, k may be defined differently depending on whether the LTE system is operated in FDD or TDD and depending on its configuration. For example, in the case of FDD LTE system, k is fixed as 4. In the case of TDD LTE system, on the other hand, k may vary depending on the subframe configuration and a subframe number. Further, at the time of data transmission through a plurality of carriers, different k values may be applied depending on TDD configuration of each carrier. In the case of TDD, the k value is determined depending on TDD UL/DL configuration as shown in the following Table 4.

TABLE 4

| TDD UL/DL Configuration | subframe number n | | | | | | | | | |
|---|---|---|---|---|---|---|---|---|---|---|
| | 0 | 1 | 2 | 3 | 4 | 5 | 6 | 7 | 8 | 9 |
| 0 | 4 | 6 | | | 4 | 6 | | | | |
| 1 | | 6 | | 4 | | 6 | | | | 4 |
| 2 | | | | 4 | | | | 4 | | |
| 3 | 4 | | | | | | | | 4 | 4 |
| 4 | | | | | | | | | 4 | 4 |
| 5 | | | | | | | | | 4 | |
| 6 | 7 | 7 | | | | | 7 | 7 | | 5 |

The wireless communication system has been described based on the LTE system, and the contents of the present disclosure are not limited to the LTE system, but may be applied various wireless communication systems such as NR, 5G, etc. Further, in the embodiment, when applied to other wireless communication system, the k value may be changed and applied even to a system using a modulation scheme corresponding to the FDD.

Figure 3:
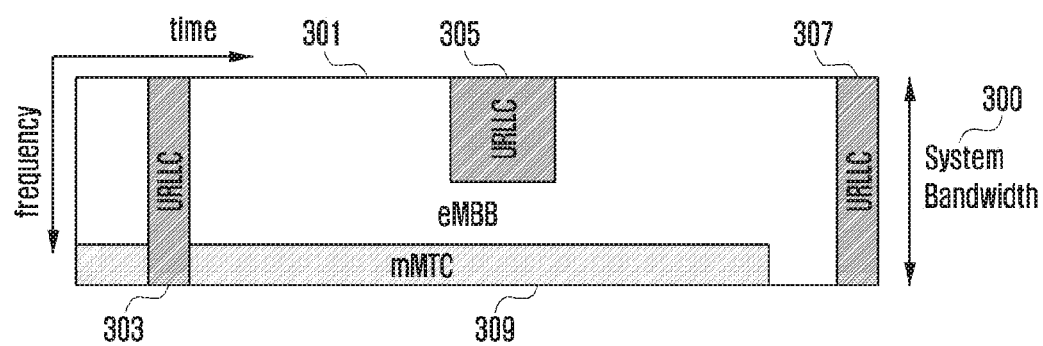
FIG. 3 is a diagram showing an example in which data for enhanced mobile broadband (eMBB), ultra-reliable and low-latency communications (URLLC), and massive machine type communications (mMTC) are allocated in a frequency-time resource in a mobile communication system according to an embodiment of the present disclosure.

FIG. 3 is a diagram showing an example in which data for enhanced mobile broadband (eMBB), ultra-reliable and low-latency communications (URLLC), and massive machine type communications (mMTC) are allocated in a frequency-time resource in a mobile communication system according to an embodiment of the present disclosure.

Figure 4:
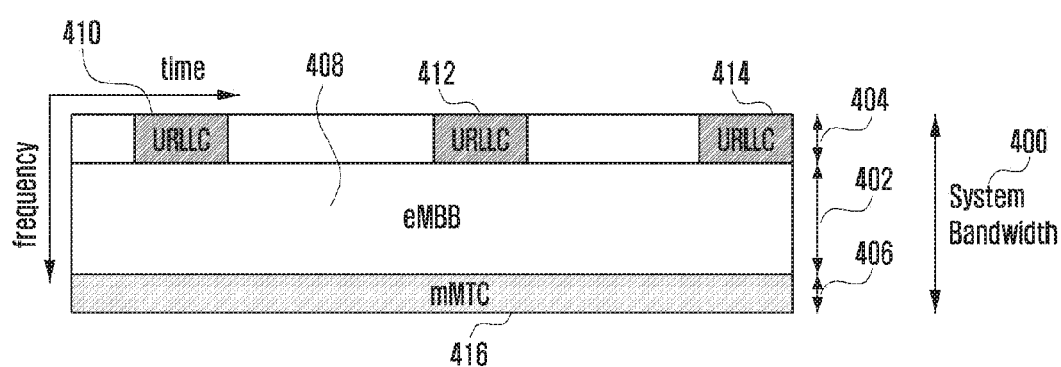
FIG. 4 is a diagram showing another example in which data for eMBB, URLLC, and mMTC are allocated in a frequency-time resource in a mobile communication system according to an embodiment of the present disclosure.

FIG. 4 is a diagram showing another example in which data for eMBB, URLLC, and mMTC are allocated in a frequency-time resource in a mobile communication system according to an embodiment of the present disclosure.

FIGS. 3 and 4 illustrate that data for eMBB, URLLC, and mMTC that are services considered by the 5G or NR system are allocated in a frequency-time resource.

FIGS. 3 and 4 show in which manner the frequency and time resources are allocated for information transmission in each system.

Referring to FIG. 3 shows that data for eMBB, URLLC, and MMTC are allocated in the entire system frequency band 300. If the URLLC data 303, 305, and 307 are generated and need to be transmitted while the eMBB data 301 and the mMTC data 309 are allocated and transmitted in specific frequency bands, the URLLC data 303, 305, and 307 may be transmitted by emptying a portion where the eMBB data 301 and the mMTC data 309 are already allocated or by not performing transmission of the eMBB data 301 and the MMTC data 309. Among the services, the URLLC requires decreased latency time, thus the URLLC data 303, 305, and 307 may be allocated and transmitted in a portion of the resource 301 where the eMBB data are allocated. If the URLLC data are additionally allocated and transmitted in the resource where the eMBB data are allocated, the eMBB data may not be transmitted in the overlapped frequency-time resource, as a result, performance of the eMBB data transmission may be decreased. That is, in the above-described case, failure of eMBB data transmission due to the URLLC allocation may occur.

Referring to FIG. 4, the entire system frequency band 400 may be divided into subbands 402, 404, and 406, and each subband 402, 404, and 406 may be used for transmission of services and data. Information related to subband configuration may be determined in advance, and the information may be transmitted by the base station to the terminal through higher layer signaling. Alternatively, the base station or a network node may arbitrarily divide the information related to the subband and provide services to the terminal without separately transmitting the subband configuration information. FIG. 4 shows that the subband 402 is used for eMBB data 408 transmission, the subband 404 is used for URLLC data 410, 412, and 414 transmission, and the subband 406 is used for mMTC data 416 transmission.

Throughout the embodiments, a length of transmission time interval (TTI) used for URLLC data transmission may be shorter than that used for eMBB or mMTC transmission. Further, a response of information related to the URLLC may be transmitted faster than that of the eMBB or the mMTC, thus the information may be transmission and received with low latency.

Figure 5:
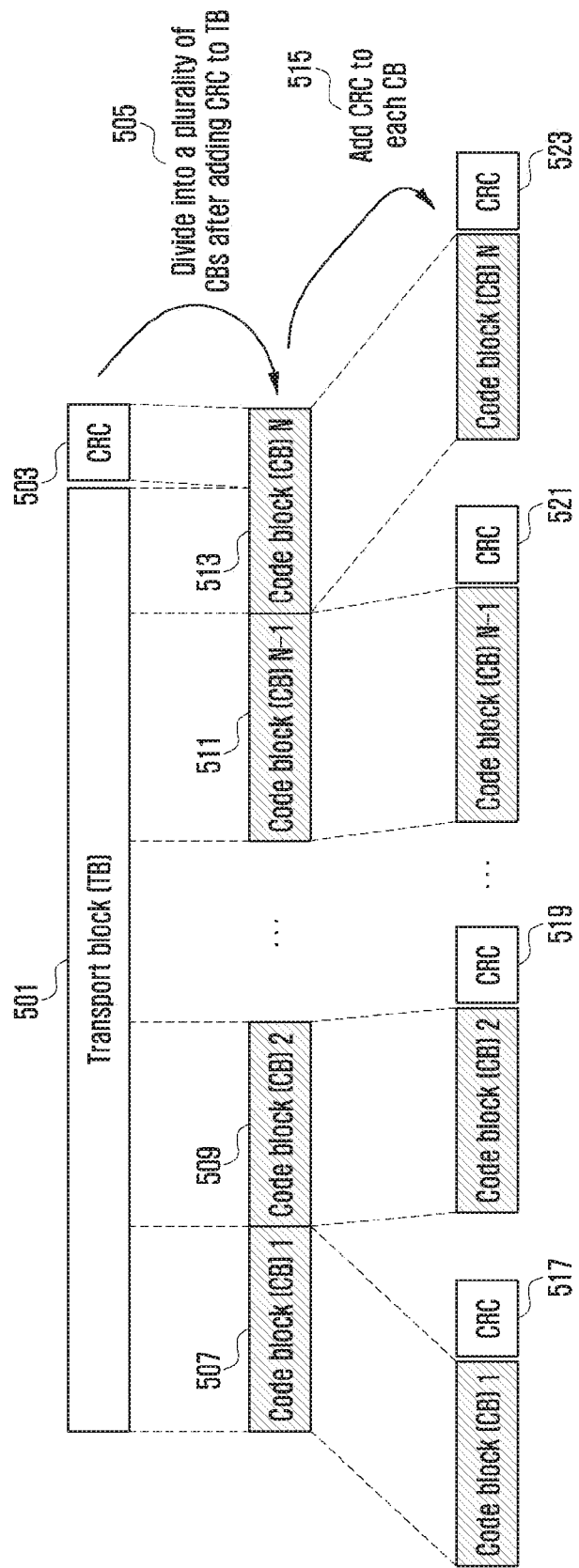
FIG. 5 is a diagram showing a structure in which one transport block is divided into a plurality of code blocks, and a cyclic redundancy check (CRC) is added in a mobile communication system according to an embodiment of the present disclosure.

FIG. 5 is a diagram showing a structure in which one transport block is divided into a plurality of code blocks, and a cyclic redundancy check (CRC) is added in a mobile communication system according to an embodiment of the present disclosure.

FIG. 5 is a diagram showing a process in which one transport block is divided into a plurality of code blocks, and a CRC is added.

Referring to FIG. 5, a CRC 503 may be added to a last portion or a front portion of one TB 501 to be transmitted through the uplink or the uplink.

The CRC may have 16 bit, 24 bits, or the number of bits that is fixed in advance, or variable number of bits depending on channel situation, or the like, and may be used to determine whether channel coding succeeded.

Blocks 501 and 503 to which the TB and the CRC are added may be divided into a plurality of code blocks CB 507, 509, 511 and 513 in operation 505. The code block may be divided by determining a maximum size thereof in advance, and in this case, the last code block 513 may be smaller than other code blocks. Alternatively, 0, a random value, or 1 may be added so that a length of the last code block is the same as that of other code blocks.

The CRCs 517, 519, 521, and 523 may be added to each of the code blocks, respectively in operation 515. The CRC may have 16 bit, 24 bits, or the number of bits that is fixed in advance, and may be used to determine whether channel coding succeeded.

However, the CRC 530 added to the TB and the CRCs 517, 519, 521, and 523 added to the code blocks may also be omitted depending on a kind of channel code to be applied to the code block. For example, if an LDPC code, instead of a turbo code, is applied to the code block, the CRCs 517, 519, 521, and 523 to be inserted into each code block may be omitted.

However, the CRCs 517, 519, 521, and 523 may be added to the code blocks, even in the case in which the LDPC code is applied. Further, the CRC may be added or omitted even in the case in which a polar code is used.

Figure 6:
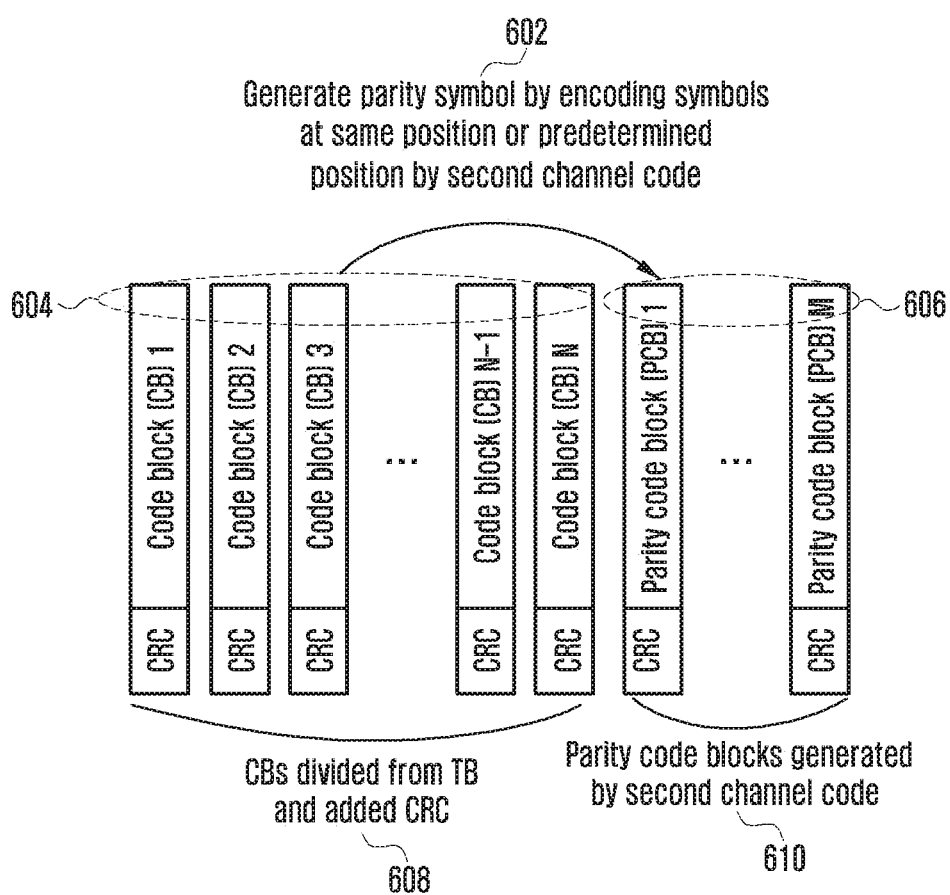
FIG. 6 is a diagram showing a structure in which an outer code is applied and coded according to an embodiment of the present disclosure.
Figure 7A:
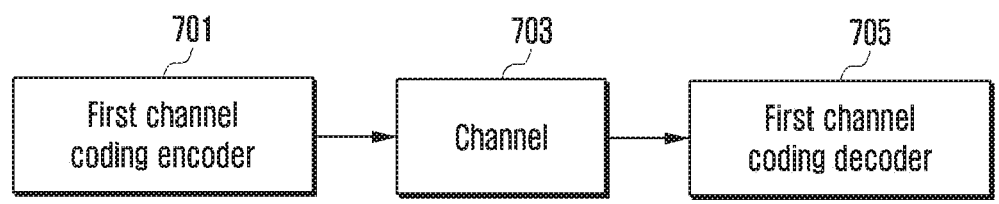
FIG. 7A is a block diagram showing channel coding in which an outer code is not applied according to the embodiment of the present disclosure.
Figure 7B:
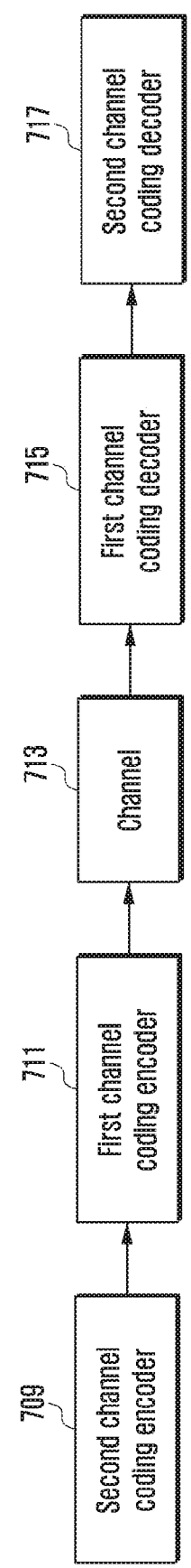
FIG. 7B is block diagrams showing channel coding in which an outer code is applied according to the embodiment of the present disclosure.

FIG. 6 is a diagram showing a structure in which an outer code is applied and coded according to an embodiment of the present disclosure. FIG. 7A is a block diagram showing channel coding in which an outer code is not applied according to the embodiment of the present disclosure. FIG. 7B is block diagrams showing channel coding in which an outer code is applied according to the embodiment of the present disclosure FIGS. 6, 7A, and 7B show a method for transmitting a signal using an outer code.

Referring to FIG. 6 shows that after one transport block is divided into a plurality of code blocks, and bits or symbols 604 in the same position in each code block may be encoded by a second channel code to generate parity bits or symbols 606 at operation 602.

Thereafter, CRCs 608 and 610 may each be added to respective code blocks and the parity code blocks generated by the second channel code encoding. The CRC may be added or omitted depending on a kind of channel code. For example, if a turbo code is used as a first channel code, the CRCs 608 and 610 are added, but after that, each of the code blocks and parity code blocks may be encoded by first channel code encoding.

Referring to FIG. 7B, if the outer code is used, data to be transmitted pass through a second channel coding encoder 709. The channel code used for the second channel coding may be, for example, a reed-solomon code, a BCH code, a raptor code, a parity bit generation code, or the like.

The bits or symbols passing through the second channel coding encoder 709 pass through a first channel coding encoder 711. The channel code used for the first channel coding may be a convolutional code, an LDPC code, a turbo code, a polar code, or the like.

When the channel-coded symbols pass through the channel 713 and are received by a receiver, the receiver may sequentially operate a first channel coding decoder 715 and a second channel coding decoder 717 based on the received signal. The first channel coding decoder 715 and the second channel coding decoder 717 may perform operations corresponding to the first channel coding encoder 711 and the second channel coding encoder 709.

On the other hand, referring to FIG. 7A, in a block diagram showing channel coding in which the outer code is not used, only the first channel coding encoder 701 and the first channel coding decoder 705 are used in the transmitter and the receiver, respectively, and the second channel coding encoder and the second channel coding decoder are not used. Even in the case in which the outer code is not used, the first channel coding encoder 701, channel 703, and the first channel coding decoder 705 may be configured identically to the first channel coding encoder 711, channel 713, and the first channel coding decoder 715 in the case in which the outer code is used.

The eMBB service described below will be referred to as a first type service, and data for eMBB will be referred to as first type data. The first type service or the first type data are not limited to eMBB, but may also correspond to the case in which high speed data transmission is required or broadband transmission is performed.

Further, the URLLC service will be referred to as a second type service, and data for URLLC will be referred to as second type data. The second type service or the second type data are not limited to URLLC, but may also correspond to the case of demanding low latency time or requiring high-reliability transmission or other systems simultaneously requiring low latency time and high reliability.

Further, the mMTC service will be referred to as a third type service, and data for mMTC will be referred to as third type data. The third type service or the third type data are not limited to mMTC, but may also correspond to the case of requiring low speed, wide coverage, or low power.

Further, when describing the embodiment, it may be understood that the first type service includes or does not include the third type service.

Structures of a physical layer channel used to transmit the three types of services or data may be different for each type. For example, at least one of a length of TTI, an allocation unit of the frequency resource, a structure of the control channel, and a data mapping method.

Hereinabove, although the description has been provided based on three types of services and three types of data, but more kinds of services and data corresponding thereto may exist, and even in this case, the content of the present disclosure may be applied.

In order to describe a method and an apparatus suggested in the embodiments, terms "physical channel" and "signal" in the existing LTE or LTE-A system may be used. However, the contents of the present disclosure may be applied in a wireless communication system rather than the LTE and LTE-A system.

In the embodiments, as described above, a transmission and reception operation of the terminal and the base station for transmission of the first, second, and third type services or data is defined, and a detailed method for operating terminals scheduled for transmission of different types of services or data together in the same system is suggested. In the present disclosure, the first type terminal, the second type terminal, and the third type terminal each refer to a terminal scheduled for transmission of the first type service or data, a terminal scheduled for transmission of the second type service or data, and a terminal scheduled for transmission of the third type service or data. In the embodiments, the first type terminal, the second type terminal, and the third type terminal may be the same terminals, or terminals different from each other.

The present disclosure suggests a method for efficiently decoding an outer code applied to the first type data when the second type data are transmitted during transmission of the first type data.

Hereinafter, in the embodiment, at least one of PHICH, an uplink scheduling grant signal, and a downlink data signal will be referred to as a first signal.

Further, in the present disclosure, at least one of an uplink data signal for uplink scheduling grant and HARQ ACK/NACK for the downlink data signal will be referred to as a second signal.

In the embodiment, among signals transmitted by the base station to the terminal, a signal expecting a response from the terminal may be a first signal, and a response signal of the terminal corresponding to the first signal may be a second signal. Further, in the embodiments, a kind of service of the first signal may be at least one of eMBB, URLLC, and mMTC, and the second signal may also correspond to at least one of the services.

For example, in the LTE and LTE-A system, PUCCH format 0 or 4 and PHICH may be the first signal, and PUSCH may be the second signal corresponding thereto. Further, for example, in the LTE and LTE-A system, PDSCH may be the first signal, and PUCCH or PUSCH including HARQ ACK/NACK information of the PDSCH may be the second signal.

Hereinafter, in the embodiments, a length of TTI of the first signal which is a time value related to first signal transmission may represent a length of time for which the first signal is transmitted. Further, in the present disclosure, a length of TTI of the second signal which is a time value related to second signal transmission may represent a length of time for which the second signal is transmitted, and a length of TTI of the third signal which is a time value related to third signal transmission may represent a length of time for which the third signal is transmitted. Further, in the present disclosure, second signal transmission timing is information on when the terminal transmits the second signal and the base station receives the second signal, and may also be called second signal transmission and reception timing.

Further, in the embodiments below, if it is assumed that when the base station transmits the first signal in an n-th TTI, the terminal transmits the second signal in an n+k-th TTI, informing, by the base station, the terminal of timing for transmitting the second signal is equal to informing of the k value. Alternatively, if it is assumed that when the base station transmits the first signal in the n-th TTI, the terminal transmits the second signal in an n+4+a-th TTI, informing, by the base station, the terminal of timing for transmitting the second signal is equal to informing of the offset value a. The offset may be defined by various methods such as n+3+a, n+5+a, or the like instead of n+4+a, and the offset value a in the n+4+a value that will be mentioned below in the present disclosure may also be defined by various methods.

The contents of the present disclosure may be applied in the FDD and TDD system.

Hereinafter, in the preset disclosure, the higher layer signaling is a signal transmission method in which a signal is transmitted from the base station to the terminal using a physical layer downlink data channel, or from the terminal to the base station using a physical layer uplink data channel, and may also be mentioned as RRC signaling, PDCP signaling, or an MAC control element (MAC CE).

The present disclosure describes a method of determining timing for transmitting a second signal after the terminal or base station receives a first signal, but various methods may be used as the method for transmitting the second signal. For example, timing in which the terminal transmits HARQ ACK/NACK information corresponding to the PDSCH to the base station after receiving the PDSCH which is downlink data is determined according to the method described in the present disclosure, but selection of a PUCCH format used, selection of a PUCCH resource, mapping of HARQ ACK/NACK information to the PUSCH, or the like may be performed according to the method of the existing LTE.

First Embodiment

A first embodiment relates to a method for transmission and reception by the base station and the terminal by using an outer code, and will be described with reference to FIGS. 8 to 11.

As a method for informing, by the base station, the terminal that downlink or uplink transmission is performed by using an outer code, at least one of the following methods may be used: 1) a method of setting the use of an outer code by high layer signaling (first outer code setting), 2) a method of using an outer code in the case of first type transmission (second outer code setting), 3) a method of adding a bit informing the DCI of channel code use information (third outer code setting), and 4) a method of determining whether to use an outer code depending on scheduled MCS or TBS (fourth outer code setting).

Using the outer code may mean that the outer code is used as in the method described with reference to FIGS. 6 and 7, or may also mean a method in which two or more channel codes are applied by other various methods.

Figure 8:
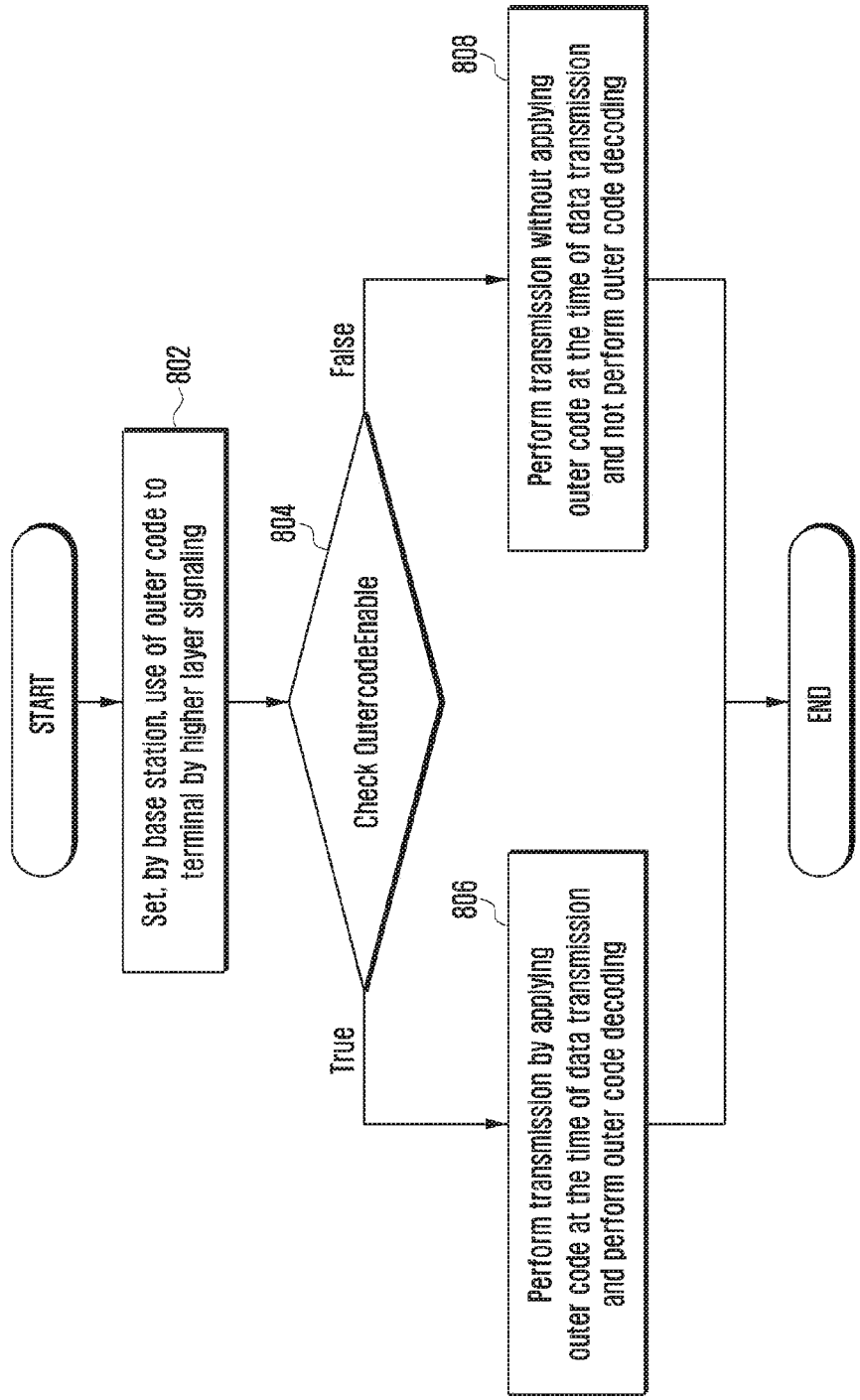
FIG. 8 is a diagram showing a method for setting an outer code according to a 1-1-th embodiment of the present disclosure.

FIG. 8 is a diagram showing a method for setting an outer code according to a 1-1-th embodiment of the present disclosure.

A first outer code setting method (or 1-1-th embodiment) illustrated in FIG. 8 relates to informing, by the base station, the terminal of whether an outer code is used through higher layer signaling. For example, it is possible to inform of whether an outer code is used by transmitting a true or false value by introducing a higher layer signaling variable of OutercodeEnable at operation 802.

A name of the variable may be determined by various methods. The terminal may check the higher layer signaling variable value transmitted from the base station at operation 804, may perform decoding of the outer code when decoding the received data if the OutercodeEnable value is true at operation 806, and may terminate decoding without performing decoding for the outer code when decoding the received data if the OutercodeEnable value is false at operation 808.

Figure 9:
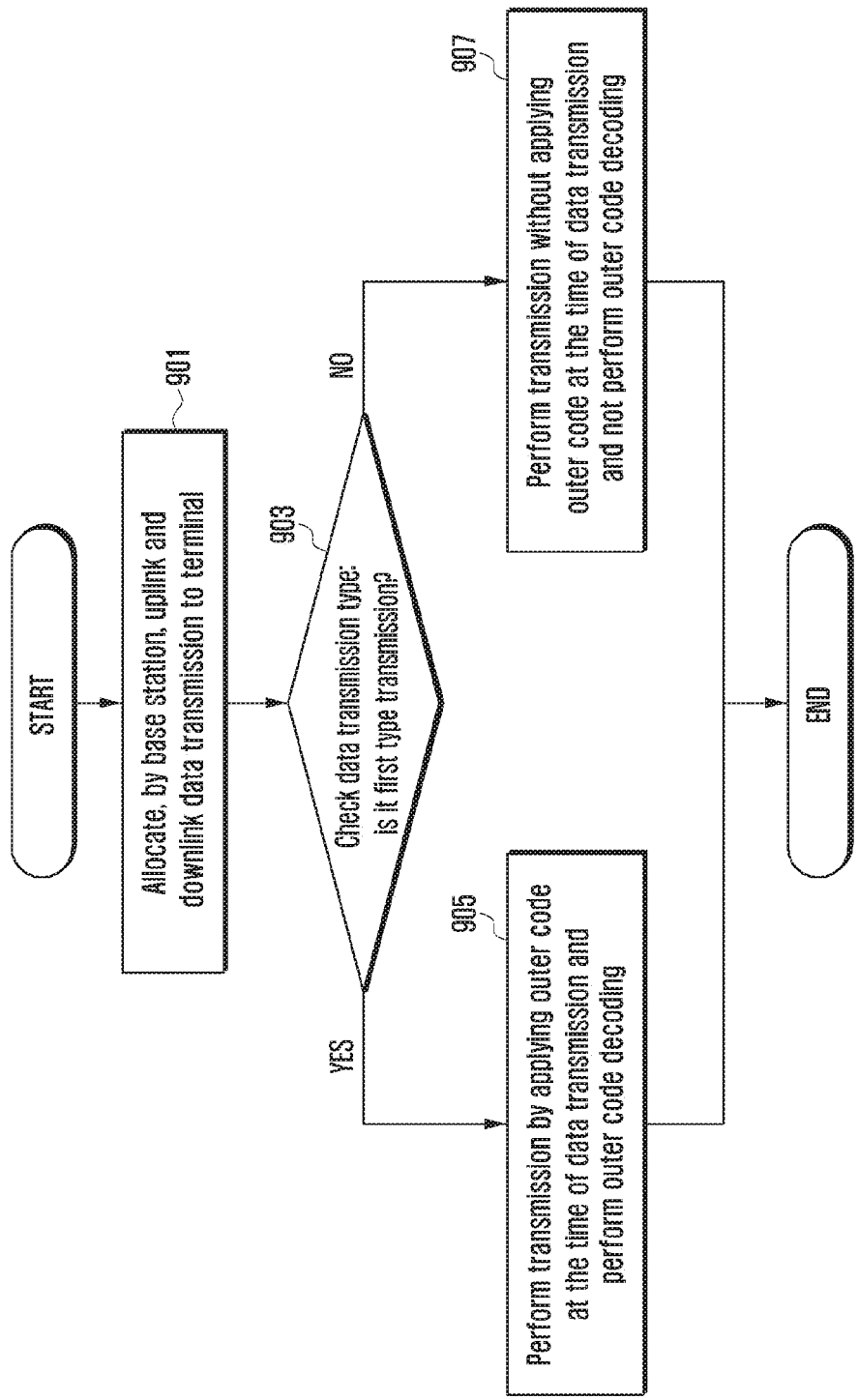
FIG. 9 is a diagram showing a method for setting an outer code according to a 1-2-th embodiment of the present disclosure.

FIG. 9 is a diagram showing a method for setting an outer code according to a 1-2-th embodiment of the present disclosure.

A second outer code setting method (or 1-2-th embodiment) illustrated in FIG. 9 is a method in which when the base station transmits a control signal and data to the terminal, if transmission of the control signal and data signal is first type transmission, the transmission is performed by applying an outer code.

The first type service may mean an eMBB service, and data for eMBB may be referred to as first type data. The first type service or the first type data are not limited to eMBB, but may also correspond to the case in which high speed data transmission is required or broadband transmission is performed.

Uplink and downlink data transmission by be allocated to the terminal by the base station at operation 901. The terminal may check a type of data to be transmitted by decoding a control signal at operation 903, and perform decoding of an outer code when decoding the data if a data signal scheduled by the control signal is the first type data at operation 905. On the contrary, if the data signal scheduled by the control signal is not the first type data, the decoding for the outer code may not be performed when decoding the data at operation 907.

Figure 10:
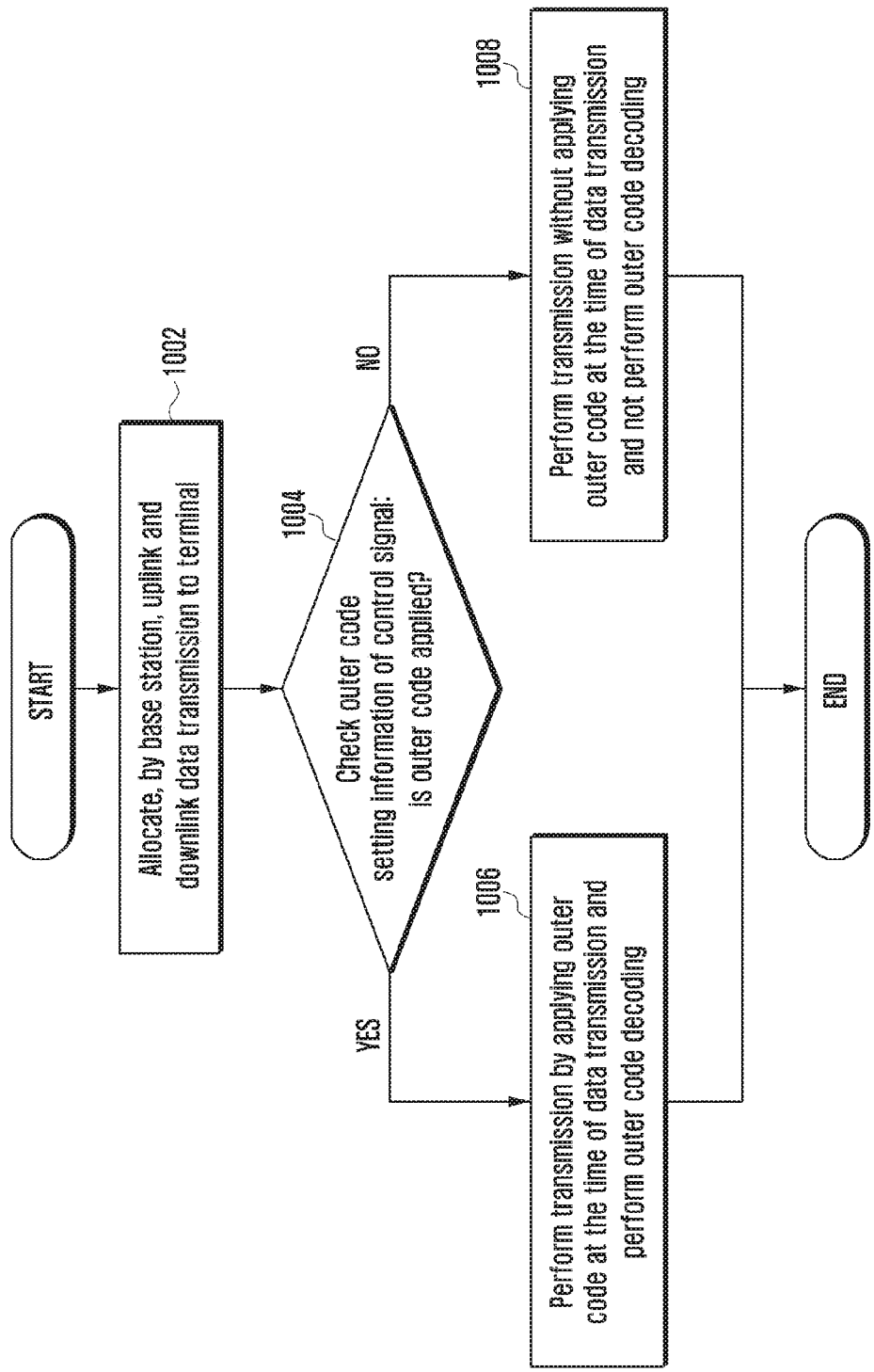
FIG. 10 is a diagram showing a method for setting an outer code according to a 1-3-th embodiment of the present disclosure.

FIG. 10 is a diagram showing a method for setting an outer code according to a 1-3-th embodiment of the present disclosure.

A third outer code setting method (or 1-3-th embodiment) illustrated in FIG. 10 is a method of adding bits informing of whether a channel code is used to downlink control information (DCI).

For example, at the time of downlink or uplink data transmission at operation 1002, when 1 bit among control signal DCI information of the data may be set as 1 if an outer code is used, and as 0 if an outer code is not used.

As another example, 2 bits among the DCI information may be bits indicating channel code use information, and 00 may indicate that a turbo code is applied, 01 may indicate that an LDPC code is applied, 10 may indicate that a turbo code and an outer code are applied, and 11 may indicate that an LDPC code and an outer code are applied.

Some of the DCI bits may be bits indicating information on the channel code applied at the time of uplink or downlink transmission scheduled by the DCI in various methods in addition to the above examples. The base station maps the corresponding DCI portion to an outer code use method depending on whether an outer code is used at operation 1004, and the terminal checks the outer code information from the DCI when receiving the DCI at operation 1004.

If the corresponding portion of the DCI is interpreted that an outer code is used, decoding on the outer code may be performed when decoding the data at operation 1006. On the contrary, If the corresponding portion of the DCI is not interpreted that an outer code is used, the decoding on the outer code may not be performed when decoding the data at operation 1008.

Figure 11:
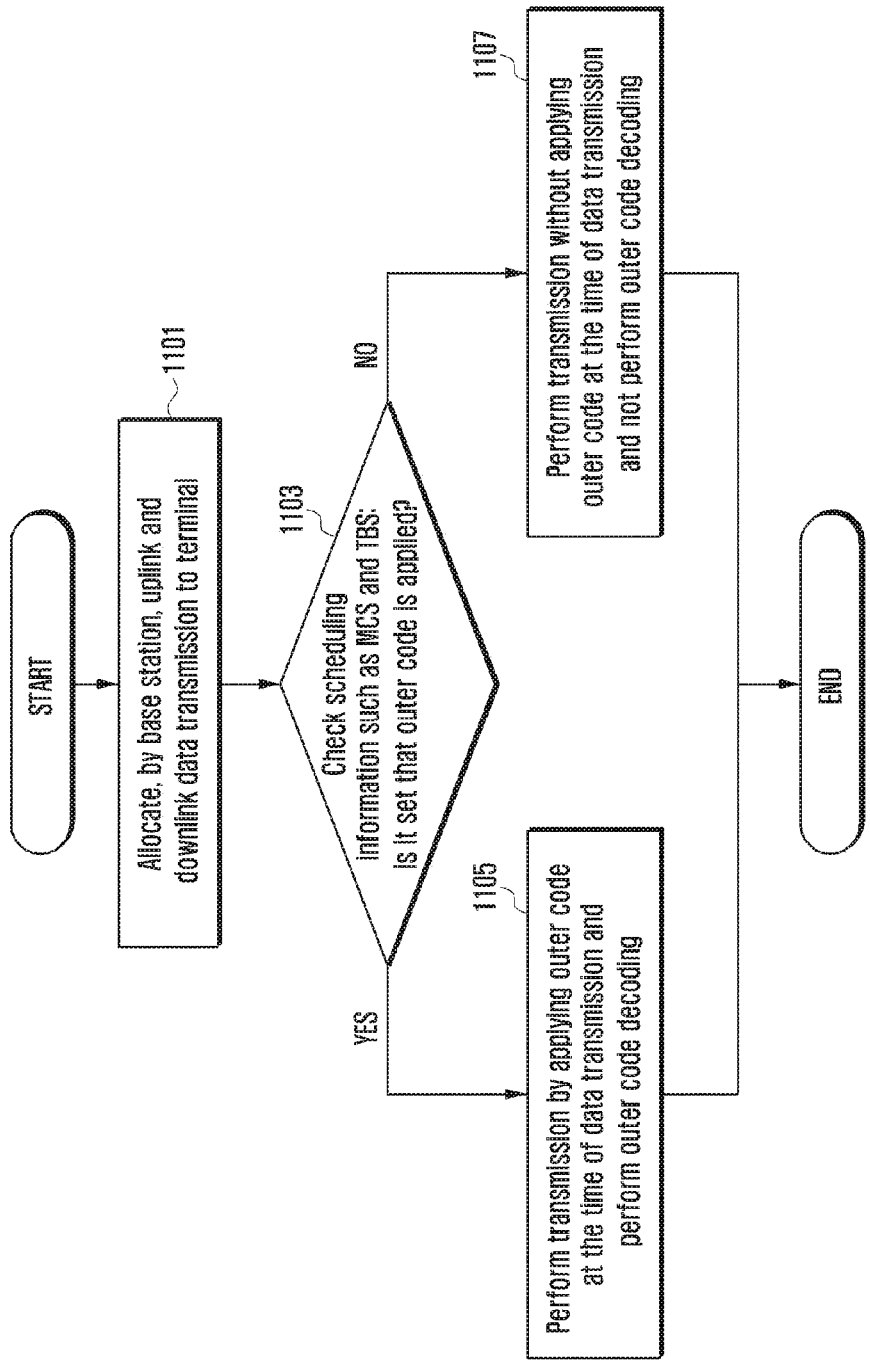
FIG. 11 is a diagram showing a method for setting an outer code according to a 1-4-th embodiment of the present disclosure.

FIG. 11 is a diagram showing a method for setting an outer code according to a 1-4-th embodiment of the present disclosure.

A fourth outer code setting method illustrated in FIG. 11 is a method in which at the time of downlink or uplink data transmission scheduling, whether to use an outer code is determined depending on a MCS value included in control information or a size of a transport block which is an amount of transmission data.

For example, when the base station schedules uplink or downlink data transmission to the terminal at operation 1101, the terminal checks whether specific scheduling information such as MCS and TBS is set as applying an outer code at operation 1103. Thereafter, if the scheduling is performed with parameters that an outer code is used, transmission is performed by applying the outer code, and reception is performed by decoding the outer code 1105.

For example, when the base station schedules data transmission to the terminal with an MCS value using modulation of 64 QAM or more, the terminal may perform encoding and decoding by applying an outer code. On the other hand, if the scheduling is performed with parameters that an outer code is not applied, transmission and reception may be performed in a state in which the outer code is not applied at operation 1107.

One or more outer code setting methods described above may be combined and used. In the embodiments, if an outer code is applied in downlink data transmission, the base station may generate and transmit data by applying the outer code, and the terminal may perform outer code decoding.

Second Embodiment

Figure 12:
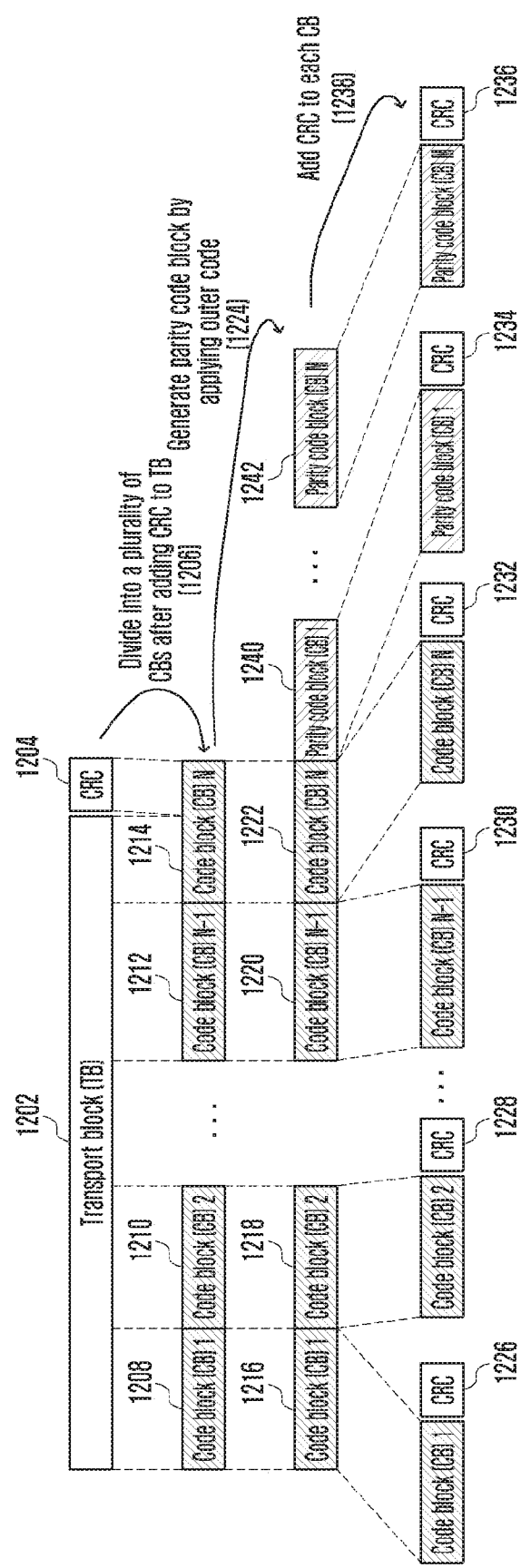
FIG. 12 is a diagram showing a parity code block generated when an outer code is applied to a code block according to an embodiment of the present disclosure.

A second embodiment describes a method for determining positions of parity code blocks generated when applying an outer code to a code block of a data block with reference to FIG. 12.

FIG. 12 is a diagram showing a parity code block generated when an outer code is applied to a code block according to an embodiment of the present disclosure.

Here, blocks 1202 and 1204 to which the TB and the CRC are added may be divided into a plurality of code blocks CB 1208, 1210, 1212 and 12014 in operation 1206. The CRCs 1216, 1218, 1220, and 1222 may be added to each of the code blocks, respectively in operation 1224. When an outer code is applied to code blocks to be transmitted, parity code blocks 1240 and 1242 are generated in operation 1224. When the outer code is used, the parity code block is positioned at the rear of the last code block in operation 1224. After the outer code is applied, CRCs 1226, 1228, 1230, 1232, 1234, and 1236 are added in operation 1238. Then, each code block and parity code block may be encoded together with the CRC by a channel code.

Third Embodiment

Figure 13:
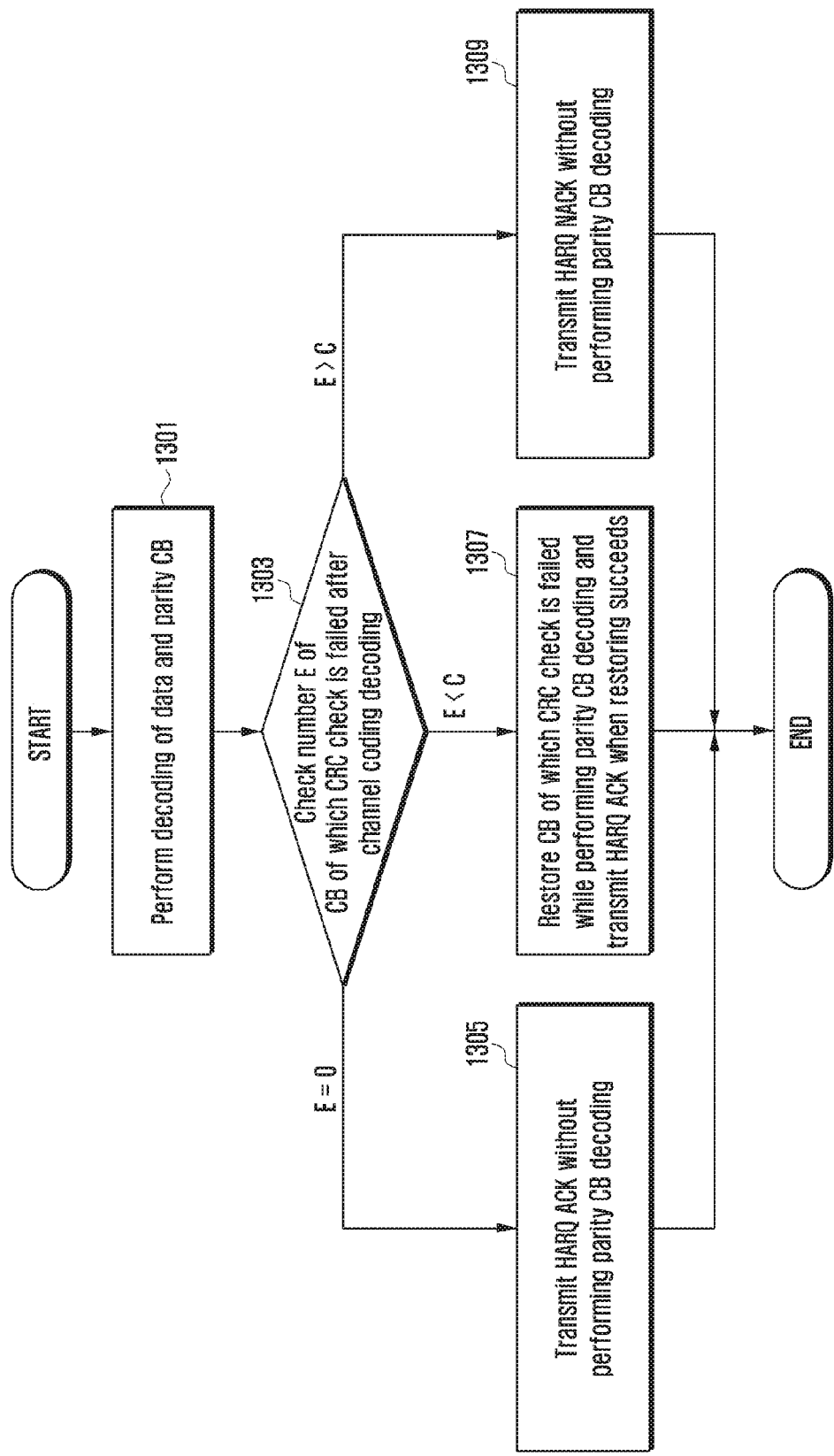
FIG. 13 is a diagram showing a decoding method according to a 3-1-th embodiment of the present disclosure.
Figure 14:
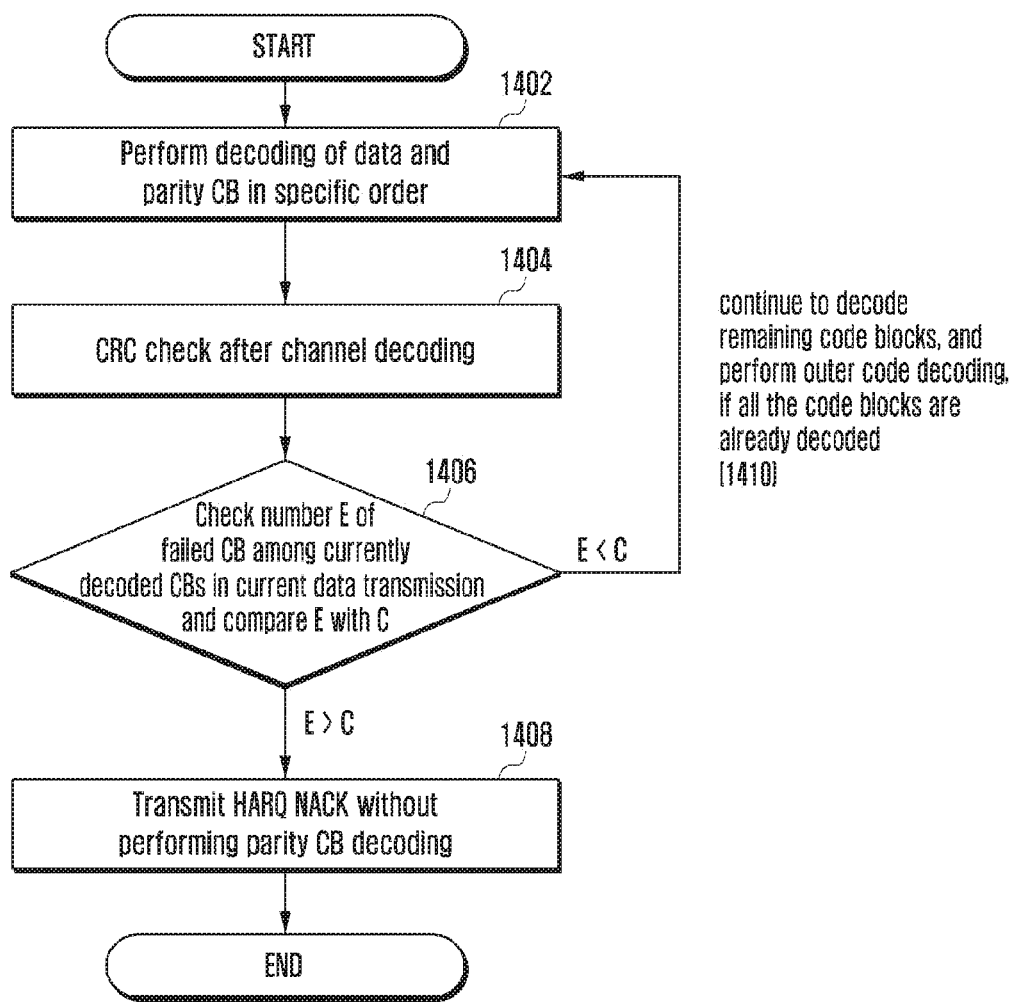
FIG. 14 is a diagram showing a decoding method according to a 3-2-th embodiment of the present disclosure.

A third embodiment describes a method for decoding an outer code at the time of data reception and decoding by the terminal in which the use of an outer code is set with reference to FIGS. 12 to 14.

FIG. 12 is a diagram showing a parity code block generated when an outer code is applied to a code block according to an embodiment of the present disclosure.

The number N of code blocks 1215, 1218, 1220, and 1222 corresponding to data and the number M of parity code blocks 1240 and 1242 in FIG. 12, and the number of code blocks that may be restored depending on the kind of the applied outer code are determined. The number of code blocks that may be restored will be represented by C in the present embodiment. That is, for example, if C is 1, when decoding of only one code block among the code blocks 1216, 1218, 1220, and 1222 corresponding to data is failed and channel decoding of all parity code blocks is succeeded, the one code block failed to be decoded may be restored through an outer code decoding process. However, when C is 1, if decoding of two or more code blocks among the code blocks 1216, 1218, 1220, and 1222 corresponding to data is failed, even if the outer code is used, restoring may not be possible. Therefore, the terminal or the base station may determine whether to decode parity code blocks by considering the number C of code blocks that may be restored when receiving data to which the outer code is applied.

FIG. 13 is a diagram showing a method for setting an outer code according to a 3-1-th embodiment of the present disclosure.

Referring to FIG. 13, is a flowchart illustrating an operation of receiving data to which an outer code is applied. Hereinafter, description will be provided based on downlink data transmission, but it may also be applied to uplink data transmission with easy modification. First, the base station transmits data to which the outer code is applied, and the terminal receives the data and may perform channel decoding by a code block unit at operation 1301. The terminal checks the number of CB of which CRC check is failed after channel decoding of the CB, and the number will be represented by E at operation 1303. That is, the number of CB of which channel code decoding is failed will be represented by E. If E is 0, the terminal may transmit HARQ ACK to the base station without performing decoding of parity code blocks and outer code decoding at operation 1305. If E is smaller than C, the terminal may restore E code blocks failed to be decoded by performing both of decoding of parity code blocks and outer code decoding, and if the restoring of the code blocks is succeeded, the terminal may transmit HARQ ACK to the base station at operation 1307. If E is larger than C, even if the outer code decoding is performed using the parity code block, it is not possible to restore a data code block failed to be decoded. Therefore, the terminal may transmit HARQ NACK to the base station without performing the outer code decoding at operation 1309.

FIG. 14 is a diagram showing a decoding method according to a 3-2-th embodiment of the present disclosure.

Referring to FIG. 14, is a flowchart illustrating a method for continuously checking the number of code blocks failed to be decoded while sequentially decoding code blocks, and comparing the number of code blocks failed to be decoded with the number of code blocks that may be restored by an outer code to determine whether to continue decoding. First, the terminal sequentially decodes code blocks corresponding to data at operation 1402 and checks CRC to determine whether the decoding is succeeded at operation 1404. Among the code blocks currently decoded, if the number of CBs of which channel code decoding is failed is E, E is compared with the number C of code blocks that may be restored by the outer code in operation 1406. If E is smaller than C, the terminal continues to decode remaining code blocks, and if all the code blocks are already decoded, performs outer code decoding at operation 1410. If E is larger than C, even if the outer code decoding is performed using the parity code block, it is not possible to restore a data code block failed to be decoded. Therefore, the terminal may transmit HARQ NACK to the base station without performing decoding of remaining code blocks or the outer code decoding at operation 1408.

Figure 15:
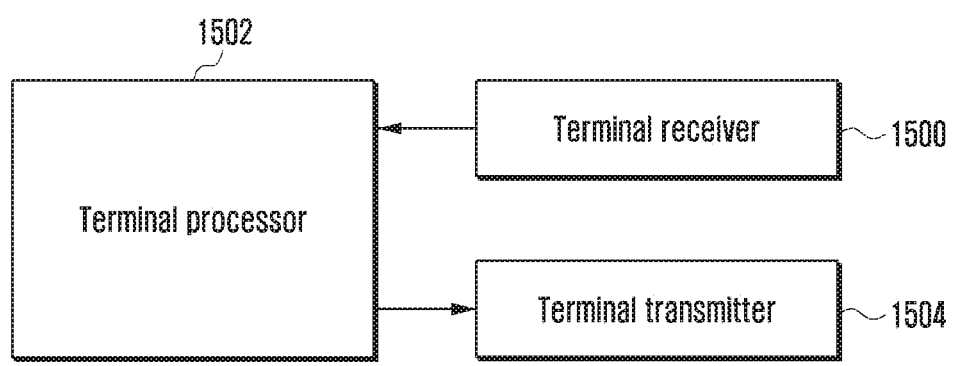
FIG. 15 is a block diagram illustrating an internal structure of a terminal according to an embodiment of the present disclosure.
Figure 16:
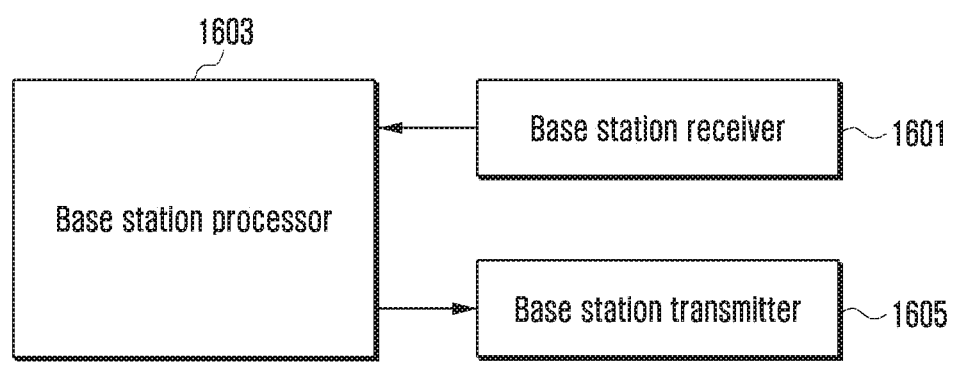
FIG. 16 is a block diagram illustrating an internal structure of a base station according to an embodiment of the present disclosure.

A transmitter, a receiver, and a processor of each of the terminal and the base station for implementing the embodiments of the present disclosure are illustrated in FIGS. 15 and 16, respectively. The first to third embodiments describe the transmission and reception methods of the base station and the terminal for performing the operations for application of an outer code of the terminal, and in order to perform the methods, the receiver, the processor, and the transmitter of the base station and the terminal need to be operated according to the respective embodiments.

Specifically, FIG. 15 is a block diagram illustrating an internal structure of a terminal according to an embodiment of the present disclosure. Referring to FIG. 15, the terminal according to the present disclosure may include a terminal receiver 1500, a terminal transmitter 1504, and a terminal processor 1502. In the embodiments of the present disclosure, the terminal receiver 1500 and the terminal transmitter 1504 may be collectively called a transceiver. The transceiver may transmit and receive a signal to and from a base station. The signal may include control information and data.

To this end, the transceiver may be configured of a radio frequency (RF) transmitter up-converting and amplifying a frequency of a transmitted signal, and an RF receiver low-noise amplifying a received signal and down-converting a frequency of the signal. Further, the transceiver may receive a signal through a wireless channel to output the signal to the terminal processor 1520, and transmit the signal output from the terminal processor 1502 through the wireless channel. The terminal processor 1502 may control a series of processes so that the terminal may be operated according to the above-described embodiments of the present disclosure.

For example, a control may be performed so that the terminal receiver 1500 receives a signal including information on whether an outer code is applied and information on data to which the outer code is applied from the base station, and the terminal processor 1502 interprets the information on whether an outer code is applied and the information on data to which the outer code is applied. Then, the terminal transmitter 1504 performs transmission by applying or not applying an outer code depending on the information.

FIG. 16 is a block diagram illustrating an internal structure of a base station according to an embodiment of the present disclosure. Referring to FIG. 16, the base station according to the present disclosure may include a base station receiver 1601, a base station transmitter 1605, and a base station processor 1603. In the embodiments of the present disclosure, the base station receiver 1601 and the base station transmitter 1605 may be collectively called a transceiver. The transceiver may transmit and receive a signal to and from a terminal. The signal may include control information and data.

To this end, the transceiver may be configured of a radio frequency (RF) transmitter up-converting and amplifying a frequency of a transmitted signal, and an RF receiver low-noise amplifying a received signal and down-converting a frequency of the signal. Further, the transceiver may receive a signal through a wireless channel to output the signal to the base station processor 1603, and transmit the signal output from the base station processor 1603 through the wireless channel. The base station processor 1603 may control a series of processes so that the base station may be operated according to the above-described embodiments of the present disclosure.

For example, a control may be performed so that the base station processor 1603 determines whether an outer code is applied, and generates information on whether the outer code is applied and data to which the outer code is applied that are to be transmitted to the terminal. Thereafter, the base station transmitter 1605 transmits the information to the terminal, the base station receiver 1601 receives the information on whether the outer code is applied and data to which the outer code is applied.

Further, according to an embodiment of the present disclosure, the base station processor 1603 may perform a control to generate downlink control information (DCI) including information on whether the outer code is applied. In this case, it may be indicated that the DCI is the information on whether the outer code is applied.

The embodiments of the present disclosure disclosed in the present specification and the accompanying drawings have been provided only as specific examples in order to assist in understanding the present disclosure and do not limit the scope of the present disclosure. It is obvious to those skilled in the art that various modifications may be made without departing from the scope of the present disclosure. Further, the respective embodiments may be combined and operated as needed. For example, parts of the first to third embodiments of the present disclosure may be combined with each other to operate the base station and the terminal. Further, the embodiments are suggested based on the LTE system, but other modified examples based on the technical spirit of the embodiments may be implemented in other systems like 5G or NR system.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. A method for decoding by a terminal in a mobile communication system, the method comprising:
   receiving data from a base station;
   receiving, from the base station via higher layer signaling, setting information on whether a second channel code which is an outer code for a first channel code is set;
   determining whether to decode the data by using the second channel code depending on the setting information;
   performing channel coding decoding for the data by a code block unit based on a result of the determination;
   identifying a first number of code block of which the channel coding decoding is failed according to a result of the channel coding decoding; and
   determining whether to decode a parity code block based on the first number of code block.

2. The method of claim 1, wherein the first channel code is one of a convolutional code, a low density parity check (LDPC) code, a turbo code, and a polar code, and the second channel code is one of a reed-solomon code, a bose chaudhuri hocquenghem (BCH) code, a raptor code, or a parity bit generation code.

3. The method of claim 1,
   wherein the setting information indicates that the second channel code is set if the setting information is a first value, and indicates that the second channel code is not set if the setting information is a second value.

4. The method of claim 1, further comprising:
   determining whether transmission type information is identical with setting type information that is set in advance that the second channel code is applied, if the setting information is the transmission type information for at least one of the data or a control signal; and
   performing the decoding by applying the second channel code if the transmission type information is identical with the setting type information.

5. The method of claim 1, wherein the setting information is set within downlink control information (DCI).

6. The method of claim 1, further comprising:
   determining whether to perform the decoding for the second channel code based on at least one of a result of a comparison between a modulation and coding scheme (MCS) and a first threshold value, or a result of a comparison between a size of the data and a second threshold value, if the setting information is at least one of the MCS or the size of data included in control information at the time of data transmission scheduling.

7. The method of claim 1, further comprising:
   transmitting, to the base station, hybrid automated repeat request (HARQ) acknowledge (ACK) without performing first channel coding decoding and second channel coding decoding for the parity code block, if there is no code block of which the channel coding decoding is failed.

8. The method of claim 1, further comprising:
   identifying a second number of code block that is restored through second channel coding decoding related to the second channel code;
   restoring the code block of which the channel coding decoding is failed by performing first channel coding decoding and the second channel coding decoding for the parity code block, if the first number is smaller than the second number; and transmitting, to the base station, hybrid automated repeat request (HARQ) acknowledge (ACK) when the restoring succeeds.

9. The method of claim 1, further comprising:
identifying a second number of code block that is restored through second channel coding decoding related to the second channel code; and
transmitting hybrid automated repeat request (HARQ) negative acknowledge (NACK) to the base station without performing first channel coding decoding and the second channel coding decoding for the parity code block, if the first number is larger than the second number.

10. A method for configuring decoding by a base station in a mobile communication system, the method comprising:
generating setting information on whether a second channel code which is an outer code for a first channel code is set; and
transmitting the setting information to a terminal via higher layer signaling,
wherein it is determined, by the terminal, whether to perform channel coding decoding of data by a code block unit using the second channel code depending on the setting information, and
wherein a first number of code block associated with a failure of the channel coding decoding is determined according to a result of the channel coding decoding, and a parity code block is decoded based on the first number of code block.

11. The method of claim 10, wherein the first channel code is one of a convolutional code, a low density parity check (LDPC) code, a turbo code, and a polar code, and the second channel code is one of a reed-solomon code, a bose chaudhuri hocquenghem (BCH) code, a raptor code, or a parity bit generation code.

12. The method of claim 10,
wherein the setting information indicates that the second channel code is set if the setting information is a first value, and indicates that the second channel code is not set if the setting information is a second value.

13. The method of claim 10, wherein the setting information is set within downlink control information (DCI).

14. The method of claim 10, wherein it is determined whether to perform decoding for the second channel code based on at least one of a result of a comparison between a modulation and coding scheme (MCS) and a first threshold value, or a result of a comparison between a size of the data and a second threshold value, if the setting information is at least one of the MCS or the size of data included in control information at the time of data transmission scheduling.

15. A terminal performing decoding in a mobile communication system, the terminal comprising:
a transceiver; and
a controller coupled with the transceiver and configured to control to:
receive data from a base station,
receive, from the base station via higher layer signaling, setting information on whether a second channel code which is an outer code for a first channel code is set,
determine whether to decode the data by using the second channel code depending on the setting information,
perform channel coding decoding for the data by a code block unit based on a result of the determination,
identify a first number of code block of which the channel coding decoding is failed according to a result of the channel coding decoding, and
determine whether to decode a parity code block based on the first number of code block.

16. The terminal of claim 15,
wherein the setting information is received through a high layer signaling, or
wherein the setting information is set within downlink control information (DCI).

17. The terminal of claim 15, wherein the controller:
determines whether transmission type information is identical with setting type information that is set in advance that the second channel code is applied, if the setting information is the transmission type information for at least one of the data or a control signal, and
performs the decoding by applying the second channel code if the transmission type information is identical with the setting type information.

18. The terminal of claim 15, wherein the controller:
identifies a second number of code block that is restored through second channel coding decoding related to the second channel code, and
transmits hybrid automated repeat request (HARQ) acknowledge (ACK) or HARQ negative acknowledge (NACK) to the base station by comparing the first number with the second number.

19. A base station configuring decoding by a terminal in a mobile communication system, the base station comprising:
a transceiver; and
a controller coupled with the transceiver and configured to control to:
generate setting information on whether a second channel code which is an outer code for a first channel code is set, and
transmit the setting information to the terminal via higher layer signaling, wherein it is determined, by the terminal, whether to perform channel coding decoding of data by a code block unit using the second channel code depending on the setting information, and
wherein a first number of code block associated with a failure of the channel coding decoding is determined according to a result of the channel coding decoding, and a parity code block is decoded based on the first number of code block.

* * * * *